US010679956B2

(12) United States Patent
Kim et al.

(10) Patent No.: US 10,679,956 B2
(45) Date of Patent: Jun. 9, 2020

(54) SEMICONDUCTOR MEMORY CHIP, SEMICONDUCTOR MEMORY PACKAGE, AND ELECTRONIC SYSTEM USING THE SAME

(71) Applicant: SAMSUNG ELECTRONICS CO., LTD., Suwon-si, Gyeonggi-Do (KR)

(72) Inventors: Kyoung Soo Kim, Hwaseong-si (KR); Won Young Kim, Seoul (KR); Sun Won Kang, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/298,754

(22) Filed: Mar. 11, 2019

(65) Prior Publication Data
US 2019/0206819 A1 Jul. 4, 2019

Related U.S. Application Data

(63) Continuation of application No. 15/847,086, filed on Dec. 19, 2017, now Pat. No. 10,269,740.

(30) Foreign Application Priority Data

May 18, 2017 (KR) .................. 10-2017-0061575

(51) Int. Cl.
*G11C 7/10* (2006.01)
*H01L 23/00* (2006.01)
(Continued)

(52) U.S. Cl.
CPC ................ *H01L 24/06* (2013.01); *G11C 5/04* (2013.01); *G11C 5/06* (2013.01); *G11C 7/106* (2013.01);
(Continued)

(58) Field of Classification Search
CPC .................................. G11C 5/024; G11C 7/12
(Continued)

(56) References Cited

U.S. PATENT DOCUMENTS 6,681,301 B1 * 1/2004 Mehta ................. G06F 13/1694
365/193
6,889,334 B1 * 5/2005 Magro ................. G11C 7/1051
324/130
(Continued)

FOREIGN PATENT DOCUMENTS

| JP | 2012003612 | 1/2012 |
| KR | 1020050011393 | 1/2005 |
| KR | 100646979 | 11/2006 |

OTHER PUBLICATIONS

Notice of Allowance dated Dec. 10, 2018 in corresponding U.S. Appl. No. 15/847,086.

*Primary Examiner* — Michael T Tran
(74) *Attorney, Agent, or Firm* — F. Chau & Associates, LLC

(57) ABSTRACT

A semiconductor memory chip includes an upper data pad region, a lower data pad region, and an additional pad region. Upper data pads, upper data strobe signal pair pads, and an upper data mask signal pad are arranged in the upper data pad region. Lower data pads, lower data strobe signal pair pads, and a lower data mask signal pad are arranged in the lower data pad region adjacent to and below the upper data pad region. An inverted termination data strobe signal pad used for a second semiconductor memory package and internally connected to the upper data mask signal pad, which is used for a first semiconductor memory package, is arranged in the additional pad region adjacent to and above the upper data pad region.

20 Claims, 17 Drawing Sheets

(51) Int. Cl.
  *G11C 5/04* (2006.01)
  *G11C 5/06* (2006.01)
  *G11C 8/18* (2006.01)
  *H01L 25/10* (2006.01)
  *H01L 23/31* (2006.01)
  *H01L 23/498* (2006.01)
  *H01L 21/56* (2006.01)

(52) U.S. Cl.
  CPC ............ *G11C 7/109* (2013.01); *G11C 7/1012* (2013.01); *G11C 7/1063* (2013.01); *G11C 7/1087* (2013.01); *G11C 8/18* (2013.01); *H01L 24/16* (2013.01); *H01L 25/105* (2013.01); *G11C 2207/105* (2013.01); *G11C 2207/107* (2013.01); *G11C 2207/108* (2013.01); *H01L 21/563* (2013.01); *H01L 23/3128* (2013.01); *H01L 23/49816* (2013.01); *H01L 24/32* (2013.01); *H01L 24/73* (2013.01); *H01L 2224/0401* (2013.01); *H01L 2224/05014* (2013.01); *H01L 2224/06151* (2013.01); *H01L 2224/16113* (2013.01); *H01L 2224/16227* (2013.01); *H01L 2224/16238* (2013.01); *H01L 2224/32225* (2013.01); *H01L 2224/73204* (2013.01); *H01L 2924/00014* (2013.01); *H01L 2924/1434* (2013.01)

(58) Field of Classification Search
  USPC .............................................. 365/51, 189.09
  See application file for complete search history.

(56) References Cited

U.S. PATENT DOCUMENTS

| | | | |
|---|---|---|---|
| 7,205,787 B1 | 4/2007 | Massoumi et al. | |
| 7,219,269 B2 * | 5/2007 | Frisch ................ | G01R 31/3187 327/115 |
| 7,292,500 B2 | 11/2007 | Liu et al. | |
| 7,323,773 B2 | 1/2008 | Hayashi et al. | |
| 7,558,132 B2 | 7/2009 | Carnevale et al. | |
| 7,818,528 B2 * | 10/2010 | Hughes ............... | G06F 13/4054 365/211 |
| 7,869,287 B2 * | 1/2011 | Searles ................ | G11C 7/1051 365/193 |
| 8,009,504 B2 * | 8/2011 | Ha ....................... | G11C 7/1045 365/230.06 |
| 8,069,296 B2 | 11/2011 | Ohtsuka et al. | |
| 8,091,061 B2 | 1/2012 | Betsui et al. | |
| 8,331,161 B2 | 12/2012 | Noh | |
| 8,368,197 B2 | 2/2013 | Kook | |
| 8,400,781 B2 * | 3/2013 | Gillingham ............ | G11C 5/02 216/18 |
| 8,447,908 B2 * | 5/2013 | Bruce .................... | G06F 12/00 710/308 |
| 8,461,864 B2 | 6/2013 | Nakagawa | |
| 8,526,247 B2 * | 9/2013 | Huber .................. | G11C 7/1084 365/189.011 |
| 8,531,622 B2 | 11/2013 | Ikeda et al. | |
| 8,947,942 B2 | 2/2015 | Ko et al. | |
| 9,035,677 B2 | 5/2015 | Nguyen et al. | |
| 9,293,178 B1 * | 3/2016 | Jeong .................... | G11C 7/109 |
| 9,588,840 B2 * | 3/2017 | Chung ................ | G06F 11/1076 |
| 9,812,187 B2 | 11/2017 | Chen et al. | |
| 10,134,466 B2 | 11/2018 | Sun | |
| 10,430,275 B2 * | 10/2019 | Tokutomi ............ | G06F 11/1048 |
| 10,431,294 B2 * | 10/2019 | Penney .................... | G11C 8/10 |
| 10,438,649 B2 * | 10/2019 | Ho ....................... | G11C 11/4093 |
| 10,452,319 B1 * | 10/2019 | Penney ............... | G11C 11/4087 |
| 2002/0120826 A1 * | 8/2002 | Venkatraman ......... | G11C 29/76 711/207 |
| 2005/0268059 A1 * | 12/2005 | LaBerge ............. | G06F 13/4086 711/167 |
| 2006/0007762 A1 * | 1/2006 | Morzano ................ | G11C 8/10 365/200 |
| 2006/0038597 A1 * | 2/2006 | Becker .................... | G11C 7/22 327/158 |
| 2008/0181047 A1 | 7/2008 | Haraguchi et al. | |
| 2009/0021998 A1 | 1/2009 | Millar et al. | |
| 2010/0111200 A1 | 5/2010 | Tanimoto | |
| 2018/0210653 A1 * | 7/2018 | Parthasarathy ....... | G06F 3/0659 |
| 2018/0337151 A1 | 11/2018 | Kim et al. | |
| 2019/0392888 A1 * | 12/2019 | Liu ..................... | G11C 11/4093 |

* cited by examiner

FIG. 2A

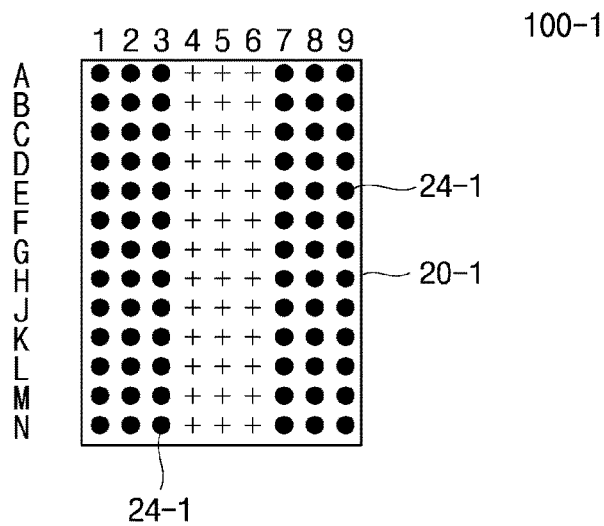

FIG. 2B

|   | 1 | 2 | 3 | 4 | 5 | 6 | 7 | 8 | 9 |   |
|---|---|---|---|---|---|---|---|---|---|---|
| A | VDDQ | VSSQ | DQU0 | | | | DQSUB | VSSQ | VDDQ | A |
| B | VPP | VSS | VDD | | | | DQSU | DQU1 | VDD | B |
| C | VDDQ | DQU4 | DQU2 | | | | DQU3 | DQU5 | VSSQ | C |
| D | VDD | VSSQ | DQU6 | | | | DQU7 | VSSQ | VDDQ | D |
| E | VSS | DMU | VSSQ | | | | DML | VSSQ | VSS | E |
| F | VSSQ | VDDQ | DQSLB | | | | DQL1 | VDDQ | ZQ | F |
| G | VDDQ | DQL0 | DQSL | | | | VDD | VSS | VDDQ | G |
| H | VSSQ | DQL4 | DQL2 | | | | DQL3 | DQL5 | VSSQ | H |
| J | VDD | VDDQ | DQL6 | | | | DQL7 | VDDQ | VDD | J |
| K | VSS | CKE | ODT | | | | CK | CKB | VSS | K |
| L | VDD | WE, A14 | ACT | | | | CS | RAS | VDD | L |
| M | VREFCA | BG0 | A10/AP | | | | A12/BC | CAS | VSS | M |
| N | VSS | BA0 | A4 | | | | A3 | BA1 | TEN | N |
| P | RESET | A6 | A0 | | | | A1 | A5 | ALERT | L |
| R | VDD | A8 | A2 | | | | A9 | A7 | VPP | M |
| T | VSS | A11 | PAR | | | | NC | A13 | VDD | N |

|   | 1 | 2 | 3 | 4 | 5 | 6 | 7 | 8 | 9 |   |
|---|---|---|---|---|---|---|---|---|---|---|
| A | VDD | VSSQ | TDQSB' |   |   |   | DM'/TDQS' | VSSQ | VSS | A |
| B | VPP | VDDQ | DQSB |   |   |   | DQ1 | VDDQ | ZQ | B |
| C | VDDQ | DQ0 | DQS |   |   |   | VDD | VSS | VDDQ | C |
| D | VSSQ | DQ4 | DQ2 |   |   |   | DQ3 | DQ5 | VSSQ | D |
| E | VSS | VDDQ | DQ6 |   |   |   | DQ7 | VDDQ | VSS | E |
| F | VDD | NC | ODT |   |   |   | CK | CKB | VDD | F |
| G | VSS | NC | CKE |   |   |   | CS | NC | NC | G |
| H | VDD | WE A14 | ACT |   |   |   | CAS A15 | RAS | VSS | H |
| J | VREFCA | BG0 | A10 AP |   |   |   | A12 BC | BG1 | VDD | J |
| K | VSS | BA0 | A4 |   |   |   | A3 | BA1 | VSS | K |
| L | RESET | A6 | A0 |   |   |   | A1 | A5 | ALERT | L |
| M | VDD | A8 | A2 |   |   |   | A9 | A7 | VPP | M |
| N | VSS | A11 | PAR |   |   |   | NC | A13 | VDD | N |

|   | 1 | 2 | 3 | 4 | 5 | 6 | 7 | 8 | 9 |   |
|---|---|---|---|---|---|---|---|---|---|---|
| A | VDD | VSSQ | NC |   |   |   | DM' | VSSQ | VSS | A |
| B | VPP | VDDQ | DQSB |   |   |   | DQ1 | VDDQ | ZQ | B |
| C | VDDQ | DQ0 | DQS |   |   |   | VDD | VSS | VDDQ | C |
| D | VSSQ | NC | DQ2 |   |   |   | DQ3 | NC | VSSQ | D |
| E | VSS | VDDQ | NC |   |   |   | NC | VDDQ | VSS | E |
| F | VDD | NC | ODT |   |   |   | CK | CKB | VDD | F |
| G | VSS | NC | CKE |   |   |   | CS | NC | NC | G |
| H | VDD | WE A14 | ACT |   |   |   | CAS A15 | RAS | VSS | H |
| J | VREFCA | BG0 | A10 AP |   |   |   | A12 BC | BG1 | VDD | J |
| K | VSS | BA0 | A4 |   |   |   | A3 | BA1 | VSS | K |
| L | RESET | A6 | A0 |   |   |   | A1 | A5 | ALERT | L |
| M | VDD | A8 | A2 |   |   |   | A9 | A7 | VPP | M |
| N | VSS | A11 | PAR |   |   |   | NC | A13 | VDD | N |

SEMICONDUCTOR MEMORY CHIP, SEMICONDUCTOR MEMORY PACKAGE, AND ELECTRONIC SYSTEM USING THE SAME

CROSS-REFERENCE TO RELATED APPLICATIONS

This application is a continuation application of U.S. patent application Ser. No. 15/847,086 filed Dec. 19, 2017, which claims priority under 35 U.S.C. § 119 to Korean Patent Application No. 10-2017-0061575, filed on May 18, 2017, the disclosures of which are incorporated by reference herein in their entirety.

TECHNICAL FIELD

Exemplary embodiments of the inventive concept relate to a semiconductor memory chip, a semiconductor memory package, and an electronic system using the same.

DISCUSSION OF THE RELATED ART

Semiconductor memory chips are fabricated into many different kinds of packages using various packaging technologies. A flip chip package is a package in which pads arranged in a body of the semiconductor memory chip are directly connected to board pads arranged on a printed circuit board (PCB) through bumps, and are also connected to balls of the semiconductor memory package through signal lines arranged in the PCB. In this case, since distances between the pads arranged in the body of the semiconductor memory chip and the balls of the semiconductor memory package are short, signal integrity may be improved, and the wirings in the PCB may be conveniently configured.

A semiconductor memory chip designed to input and output n-bit data is fabricated into semiconductor memory packages which input and output data having smaller bits than n, as well as a semiconductor memory package which inputs and outputs the n-bit data. The semiconductor memory packages have ball arrangements standardized by JOINT ELECTRON DEVICE ENGINEERING COUNCIL (JEDEC).

SUMMARY

Exemplary embodiments of the inventive concept provide a semiconductor memory chip, a semiconductor memory package, and a system using the same, which satisfies all ball arrangements of semiconductor memory packages in which the number of bits of input and output data are different from each other, and in which lengths of signal lines between corresponding pads and balls are reduced.

According to an exemplary embodiment of the inventive concept, a semiconductor memory chip includes a plurality of upper data pads disposed in an upper data pad region on a surface of the semiconductor memory chip, upper data strobe signal pair pads disposed in the upper data pad region, an upper data mask signal pad disposed in the upper data pad region, and a plurality of lower data pads disposed in a lower data pad region on the surface. The lower data pad region is adjacent to and below the upper data pad region. The semiconductor memory chip further includes lower data strobe signal pair pads disposed in the lower data pad region, a lower data mask signal pad disposed in the lower data pad region, and an inverted termination data strobe signal pad disposed in an additional pad region adjacent to and above the upper data pad region. The inverted termination data strobe signal pad is internally connected to the upper data mask signal pad, the inverted termination data strobe signal pad is used to connect the semiconductor memory chip to a second printed circuit board (PCB) in a second semiconductor memory package having a second configuration, and the upper data mask signal pad is used to connect the semiconductor memory chip to a first PCB in a first semiconductor memory package having a first configuration different from the second configuration.

According to an exemplary embodiment of the inventive concept, a semiconductor memory chip includes a plurality of upper data pads disposed in an upper data pad region on a surface of the semiconductor memory chip, upper data strobe signal pair pads disposed in the upper data pad region, an upper data mask signal pad disposed in the upper data pad region, and a plurality of lower data pads disposed in a lower data pad region on the surface. The lower data pad region is adjacent to and below the upper data pad region. The semiconductor memory chip further includes lower data strobe signal pair pads disposed in the lower data pad region, a lower data mask signal pad disposed in the lower data pad region, and a data mask signal/termination data strobe signal pad disposed in an additional pad region that is adjacent to and above the upper data pad region. The data mask signal/termination data strobe signal pad is internally connected to the lower data mask signal pad, the data mask signal/termination data strobe signal pad is used to connect the semiconductor memory chip to a second printed circuit board (PCB) in a second semiconductor memory package or a third PCB in a third semiconductor memory package, and the lower data mask signal pad is used to connect the semiconductor memory chip to a first PCB in a first semiconductor memory package. The first semiconductor memory package has a first configuration, the second semiconductor memory package has a second configuration, the third semiconductor memory package has a third configuration, and the first, second and third configurations are different from one another.

According to an exemplary embodiment of the inventive concept, a semiconductor memory package includes a semiconductor memory chip and a printed circuit board (PCB). The semiconductor memory chip includes a plurality of upper data pads disposed in an upper data pad region on a surface of the semiconductor memory chip, upper data strobe signal pair pads disposed in the upper data pad region, an upper data mask signal pad disposed in the upper data pad region, and a plurality of lower data pads disposed in a lower data pad region on the surface. The lower data pad region is adjacent to and below the upper data pad region. The semiconductor memory chip further includes lower data strobe signal pair pads disposed in the lower data pad region, a lower data mask signal pad disposed in the lower data pad region, and an inverted termination data strobe signal pad disposed in an additional pad region that is adjacent to and above the upper data pad region. The inverted termination data strobe signal pad is internally connected to the upper data mask signal pad and is used for a second semiconductor memory package having a second configuration, and the upper data mask signal pad is used for a first semiconductor memory package having a first configuration different from the second configuration. The PCB includes first board pads arranged in positions corresponding to the upper data pads and the inverted termination data strobe signal pad of the semiconductor memory chip, and lines arranged for connecting first balls of the second semiconductor memory package corresponding to the first board pads. The semiconductor memory package is one of the first semiconductor memory package and the second semiconductor memory package.

According to an exemplary embodiment of the inventive concept, a semiconductor memory package includes a semiconductor memory chip and a PCB. The semiconductor memory chip includes a plurality of upper data pads disposed in an upper data pad region on a surface of the semiconductor memory chip, upper data strobe signal pair pads disposed in the upper data pad region, an upper data mask signal pad disposed in the upper data pad region, and a plurality of lower data pads disposed in a lower data pad region on the surface. The lower data pad region is adjacent to and below the upper data pad region. The semiconductor memory chip further includes lower data strobe signal pair pads disposed in the lower data pad region, a lower data mask signal pad disposed in the lower data pad region, and a data mask signal/termination data strobe signal pad disposed in an additional pad region adjacent to and above the upper data pad region. The data mask signal/termination data strobe signal pad is internally connected to the lower data mask signal pad and is used for a second semiconductor memory package having a second configuration and a third semiconductor memory package having a third configuration, and the lower data mask signal pad is used for a first semiconductor memory package having a first configuration. The first, second and third configurations are different from one another. The PCB includes first board pads arranged in positions corresponding to the upper data pads and the data mask signal/termination data strobe signal pad of the semiconductor memory chip, and lines arranged for connecting the first boards pads and first balls of the second or the third semiconductor memory package corresponding to the first board pads. The semiconductor memory package is one of the first semiconductor memory package, the second semiconductor memory package, and the third semiconductor memory package.

According to an exemplary embodiment of the inventive concept, an electronic system includes a plurality of semiconductor memory modules and a memory system. The plurality of semiconductor memory modules include a plurality of semiconductor memory packages, each including a semiconductor memory chip and a PCB. The memory system includes a memory controller that generates an address and command signal for inputting and outputting data to and from the plurality of semiconductor memory modules. The semiconductor memory chip includes a plurality of upper data pads disposed in an upper data pad region on a surface of the semiconductor memory chip, upper data strobe signal pair pads disposed in the upper data pad region, an upper data mask signal pad disposed in the upper data pad region, and a plurality of lower data pads disposed in a lower data pad region on the surface. The lower data pad region is adjacent to and below the upper data pad region. The semiconductor memory chip further includes lower data strobe signal pair pads disposed in the lower data pad region, a lower data mask signal pad disposed in the lower data pad region, and an inverted termination data strobe signal pad disposed in an additional pad region adjacent to and above the upper data pad region. The inverted termination data strobe signal pad is internally connected to the upper data mask signal pad, the inverted termination data strobe signal pad is used to connect the semiconductor memory chip in a second semiconductor memory package, and the upper data mask signal pad is used to connect the semiconductor memory chip in a first semiconductor memory package. The first semiconductor memory package has a first configuration, and the second semiconductor memory package has a second configuration different from the first configuration. The PCB includes a first board pad arranged in a position corresponding to the inverted termination data strobe signal pad of the semiconductor memory chip, and a line arranged for connecting a first ball of the second semiconductor memory package corresponding to the first board pad. The memory system is arranged in a system board.

BRIEF DESCRIPTION OF THE DRAWINGS

The above and other features of the present inventive concept will become more apparent by describing in detail exemplary embodiments thereof with reference to the accompanying drawings, in which:

FIGS. 2A and 2B are diagrams illustrating an arrangement of balls of a ×16 semiconductor memory package and signals (e.g., data signals and voltage signals) transmitted through the balls according to an exemplary embodiment of the inventive concept.

DETAILED DESCRIPTION OF THE EXEMPLARY EMBODIMENTS

Figure 1:
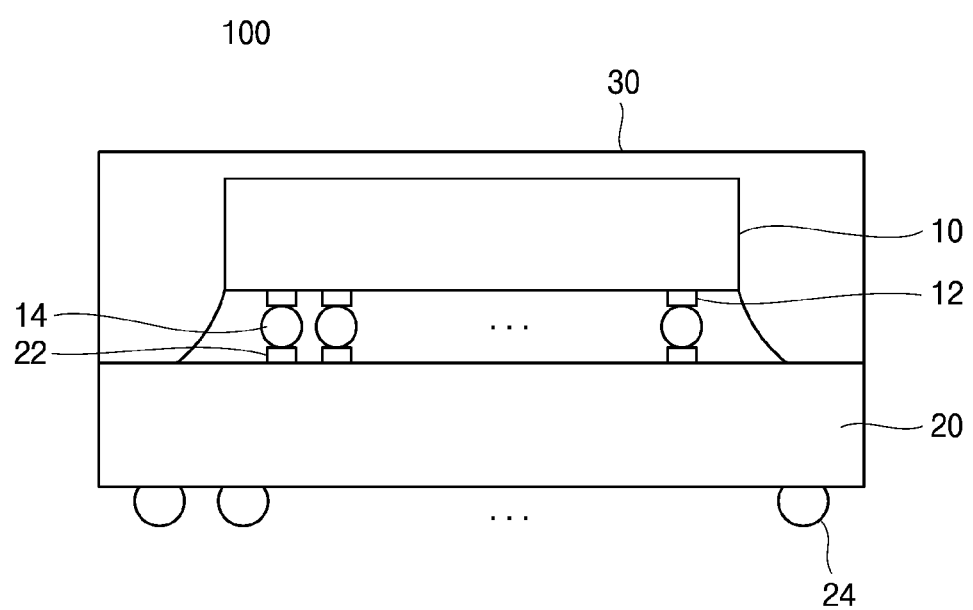
FIG. 1 is a diagram illustrating a structure of a semiconductor memory package according to an exemplary embodiment of the inventive concept.

Hereinafter, a semiconductor memory chip, a semiconductor memory package, and an electronic system using the same according to exemplary embodiments of the inventive concept will be described with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. It will be understood that the terms "first," "second," "third," etc. are used herein to distinguish one element from another, and the elements are not limited by these terms. Thus, a "first" element in an exemplary embodiment may be described as a "second" element in another exemplary embodiment. Herein, the terms "arranged" and "disposed" may be used interchangeably.

FIG. 1 is a diagram illustrating a structure of a semiconductor memory package according to an exemplary embodiment of the inventive concept.

Referring to FIG. 1, in an exemplary embodiment, a semiconductor memory package 100 includes a semiconductor memory chip 10, a printed circuit board (PCB) (20), bumps 14, an encapsulant 30, and balls 24. The semiconductor memory chip 10 includes pads 12 arranged on a body of the semiconductor memory chip 10 (e.g., on a surface of the semiconductor memory chip 10) to input and/or output signals. The PCB 20 includes board pads 22 disposed on an upper surface of the PCB and arranged at positions corresponding to the pads 12 arranged on the semiconductor memory chip 10. The bumps 14 are arranged between each of the pads 12 of the semiconductor memory chip 10 and each of the board pads 22 of the PCB 20, and electrically connect corresponding pads 12 and board pads 22. The balls 24 are arranged at a lower surface of the PCB 20, and are exposed to the outside of the semiconductor memory package 100. The PCB 20 may include lines arranged to connect the board pads 22 and the balls 24. The encapsulant 30 encapsulates upper surfaces the semiconductor memory chip 10 and the PCB 20. The encapsulant 30 may be, for example, a chemical resin. The semiconductor memory package 100 shown in FIG. 1 may be, for example, a flip chip package.

FIGS. 2A and 2B illustrate arrangements of balls 24-1 of a ×16 semiconductor memory package 100-1 and signals (e.g., data signals and voltage signals) transmitted through the balls 24-1 according to an exemplary embodiment of inventive concept, and illustrate arrangements of balls of signals (e.g., data signals and voltage signals) standardized by JOINT ELECTRON DEVICE ENGINEERING COUNCIL (JEDEC).

Herein, a ×16 semiconductor memory package, a ×8 semiconductor memory package, and a ×4 semiconductor memory package refer to semiconductor memory packages having different configurations (e.g., a first configuration, a second configuration, and a third configuration) from one another. In an exemplary embodiment, first, second and third semiconductor memory packages in which a semiconductor memory chip can be mounted may be ×16n, ×8n, and ×4n (n is an integer equal to or greater than 1) semiconductor memory packages, respectively, and the first configuration, the second configuration, and the third configuration have ball arrangements standardized by JOINT ELECTRON DEVICE ENGINEERING COUNCIL (JEDEC).

Referring to FIG. 2A, a total of 98 balls may be arranged at positions where 16 rows A to T and 6 columns 1 to 3 and 7 to 9 of a lower surface of a PCB 20-1 of the ×16 semiconductor memory package 100-1 intersect, respectively.

Referring to FIGS. 2A and 2B, upper data strobe signal pair balls DQSUB and DQSU may be arranged at positions where rows A and B and column 7 intersect, upper data balls DQU0 to DQU7 may be arranged at positions where row A and column 3 intersect, row B and column 8, and row C and columns 3, 7, 2 and 8 intersect, and row D and columns 3 and 7 intersect, and an upper data mask signal ball DMU may be arranged at a position where row E and column 2 intersect. A lower data mask signal ball DML may be arranged at a position where row E and column 7 intersect, lower data strobe signal pair balls DQSLB and DQSL may be arranged at positions where rows F and G and column 3 intersect, and lower data balls DQL0 to DQL7 may be arranged at positions where row G and column 2, row F and column 7, row H and columns 3, 7, 2 and 8, and row J and columns 3 and 7 intersect. Remaining balls may be power balls VDDQ, VSSQ, VDD, VPP and VSS, and address and command signal balls. Power balls may also be referred to as voltage balls.

Figures 3A, 3B:
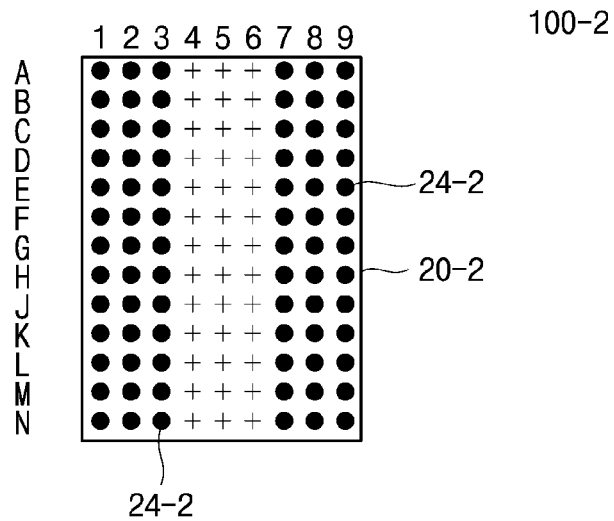
FIGS. 3A and 3B are diagrams illustrating an arrangement of balls of a ×8 semiconductor memory package and signals (e.g., data signals and voltage signals) transmitted through the balls according to an exemplary embodiment of the inventive concept.

FIGS. 3A and 3B illustrate arrangements of balls 24-2 of a ×8 semiconductor memory package 100-2 and signals (e.g., data signals and voltage signals) transmitted through the balls 24-2 according to an exemplary embodiment of the inventive concept, and illustrate arrangements of balls of signals (e.g., data signals and voltage signals) standardized by JEDEC.

Referring to FIG. 3A, a total of 78 balls may be arranged at positions where 13 rows A to N and 6 columns 1 to 3 and 7 to 9 of a lower surface of a PCB 20-2 of the ×8 semiconductor memory package 100-2 intersect.

Referring to FIGS. 3A and 3B, an inverted termination data strobe signal ball TDQSB' and a data mask signal/termination data strobe signal ball DM'/TDQS' may be arranged at positions where row A and columns 3 and 7 intersect, data strobe signal pair balls DQSB and DQS may be arranged at positions where rows B and C and column 3 intersect, and data balls DQ0 to DQ7 may be arranged at positions where row C and column 2, row B and column 7, row D and columns 3, 7, 2 and 8, and row E and columns 3 and 7 intersect. Remaining balls may be power balls VDDQ, VSSQ, VDD, VPP and VSS, address and command signal balls, and no connection (NC) balls.

Figures 4A, 4B:
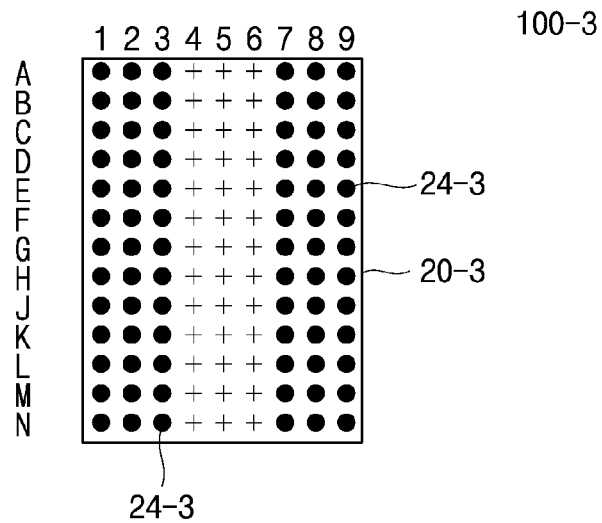
FIGS. 4A and 4B are diagrams illustrating an arrangement of balls of a ×4 semiconductor memory package and signals (e.g., data signals and voltage signals) transmitted through the balls according to an exemplary embodiment of the inventive concept.

FIGS. 4A and 4B illustrate arrangements of balls 24-3 of a ×4 semiconductor memory package 100-3 and signals (e.g., data signals and voltage signals) transmitted through the balls 24-3 according to an exemplary embodiment of the inventive concept, and illustrate arrangements of the balls of signals (e.g., data signals and voltage signals) standardized by JEDEC.

Referring to FIG. 4A, a total of 78 balls may be arranged at positions where 13 rows A to N and 6 columns 1 to 3 and 7 to 9 of a lower surface of a PCB 20-3 of the ×4 semiconductor memory package 100-3 intersect.

Referring to FIGS. 4A and 4B, data strobe signal pair balls DQSB and DQS may be arranged at positions where rows B and C and column 3 intersect, a data mask signal ball DM may be arranged at a position where row A and column 7 intersect, and data balls DQ0 to DQ3 may be arranged at positions where row C and column 2, row B and column 7, and row D and columns 3 and 7 intersect. Remaining balls may be power balls VDDQ, VSSQ, VDD, VPP and VSS, and address and command signal balls, and no connection balls (NC).

Figure 5:
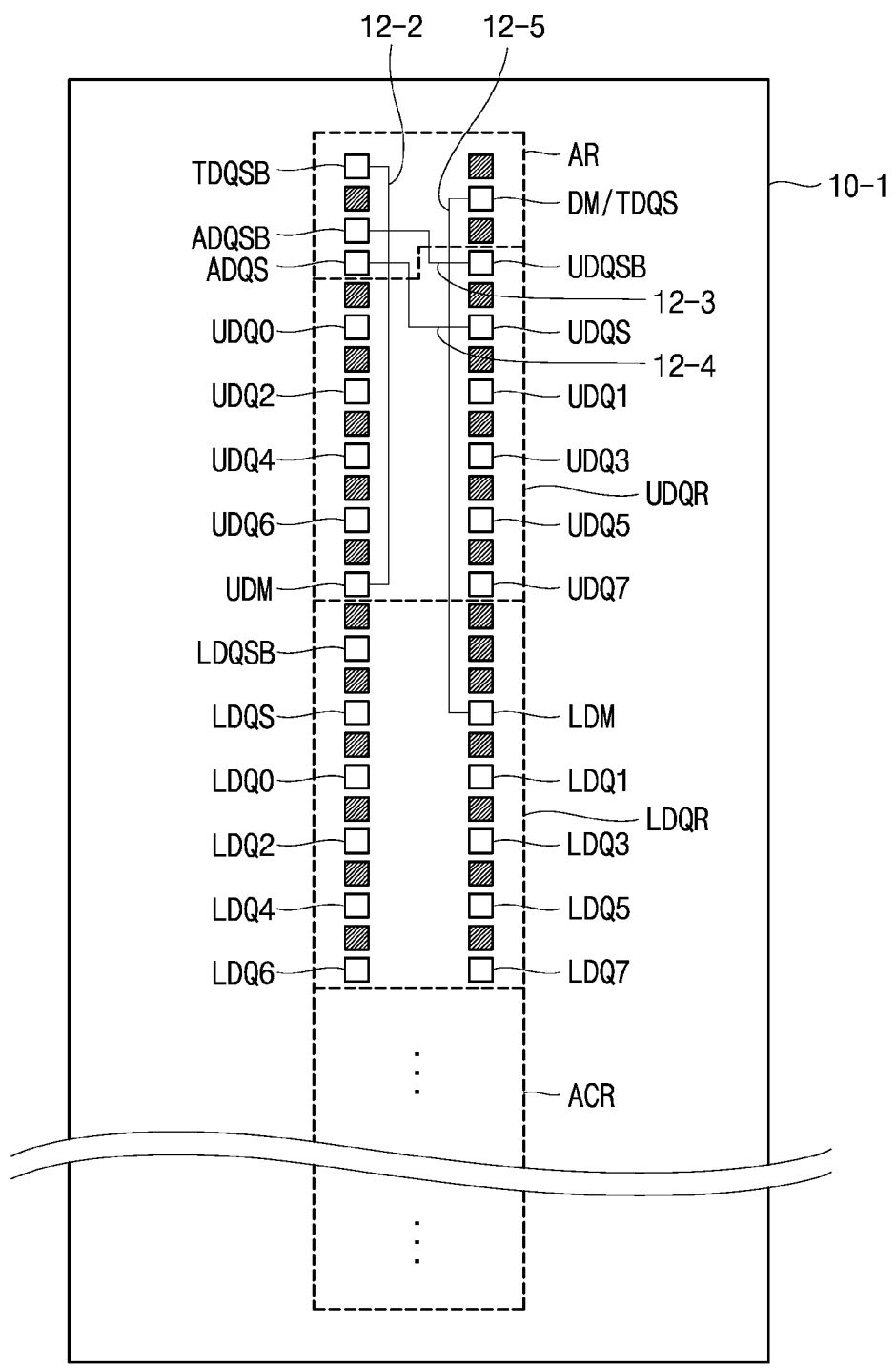
FIG. 5 is a diagram illustrating pad arrangements of a ×16 semiconductor memory package according to an exemplary embodiment of the inventive concept.

FIG. 5 is a diagram illustrating pad arrangements of a ×16 semiconductor memory chip 10-1 according to an exemplary embodiment of the inventive concept.

Referring to FIG. 5, a body of the ×16 semiconductor memory chip 10-1 may be divided into an additional pad region AR, an upper data pad region UDQR, a lower data pad region LDQR, and an address and command signal pad region ACR. The regions AR, UDQR, LDQR, and ACR may be arranged in one direction in the center of the body. For example, in a plan view, the regions AR, UDQR, LDQR, and ACR may be sequentially arranged from a top portion of the ×16 semiconductor memory chip 10-1 to a bottom portion of the ×16 semiconductor memory chip 10-1. For example, the regions AR, UDQR, LDQR, and ACR may be sequentially disposed adjacent to one another in a vertical direction in a plan view (e.g., region ACR is disposed below region LDQR, region LDQR is disposed below region UDQR, and region UDQR is disposed below region AR).

Herein, according to exemplary embodiments of the inventive concept, when a pad of a semiconductor memory chip is described as being used for a certain semiconductor memory package (e.g., the ×16 semiconductor memory package 100-1, the ×8 semiconductor memory package 100-2, or the ×4 semiconductor memory package 100-3), the pad is used to electrically connect the pad to a printed circuit board (PCB) within that semiconductor memory package. The ×16 semiconductor memory chip 10-1 may include upper data pads UDQ0 to UDQ7, upper data strobe signal pair pads UDQSB and UDQS, and an upper data mask signal pad UDM arranged in the upper data pad region UDQR. The upper data pads UDQ0 to UDQ7, the upper data strobe signal pair pads UDQSB and UDQS, and the upper data mask signal pad UDM may be used for the ×16 semiconductor memory package 100-1 (e.g. used to electrically connect the ×16 semiconductor memory chip 10-1 to a PCB in the ×16 semiconductor memory package 100-1), and the upper data pads UDQ0 to UDQ7 or UDQ0 to UDQ3 may be used for the ×8 or ×4 semiconductor memory package 100-2 or 100-3. The upper data pads UDQ4 to UDQ7 may be optionally used for the ×4 semiconductor memory package 100-3. The ×16 semiconductor memory chip 10-1 may transmit upper data, an upper data strobe signal pair, and an upper data mask signal through the upper data pads UDQ0 to UDQ7, the upper data strobe signal pair pads UDQSB and UDQS, and the upper data mask signal pad UDM for the ×16 semiconductor memory package 100-1 (e.g., when the ×16 semiconductor memory chip 10-1 is disposed/mounted in the ×16 semiconductor memory package 100-1), and internally generate lower data for the ×8 and ×4 semiconductor memory packages 100-2 and 100-3 (e.g., when disposed/mounted in the ×8 and ×4 semiconductor memory packages 100-2 and 100-3), and transmit the lower data through the upper data pads UDQ0 to UDQ7 or UDQ0 to UDQ3 when the chip is disposed/mounted in the ×8 and ×4 semiconductor memory packages 100-2 and 100-3. Exemplary embodiments of a configuration of an internal circuit of the ×16 semiconductor memory chip 10-1 will be described hereinafter. The upper data strobe signal pair pads UDQSB and UDQS may input and output the upper data strobe signal pair, which is input and output together with the upper data. The upper data mask signal pad UDM may input the upper data mask signal for masking the input upper data. Further, the upper data mask signal pad UDM may have a load connected to match a load with the upper data strobe signal pair pads UDQSB and UDQS, and the load may perform a signal termination function to terminate a signal input from the outside.

As shown in FIG. 5, in an exemplary embodiment, the upper data pads UDQ0, UDQ2, UDQ4 and UDQ6, and the upper data mask signal pad UDM are arranged in the left side in the upper data pad region UDQR. The upper data strobe signal pair pads UDQSB and UDQS, and the upper data pads UDQ1, UDQ3, UDQ5 and UDQ7 are arranged in the right side in the upper data pad region UDQR. Power pads are arranged between the upper data pads UDQ0, UDQ2, UDQ4 and UDQ6, and the upper data mask signal pad UDM, and between the upper data strobe signal pair pads UDQSB and UDQS, and the upper data pads UDQ1, UDQ3, UDQ5 and UDQ7. The power pads are indicated by the shaded pads in FIG. 5.

For example, in an exemplary embodiment, when viewed from a plan view, the upper data pads UDQ0, UDQ2, UDQ4 and UDQ6, and the upper data mask signal pad UDM are arranged sequentially from an upper portion of the upper data pad region UDQR to a lower portion of the upper data pad region UDQR, and are arranged closer to a left side of the upper data pad region UDQR than to a right side of the upper data pad region UDQR (and thus, closer to a left side of the ×16 semiconductor memory chip 10-1 than to a right side of the ×16 semiconductor memory chip 10-1). The upper data pads UDQ0, UDQ2, UDQ4 and UDQ6, and the upper data mask signal pad UDM may be substantially aligned with one another from the upper portion of the upper data pad region UDQR to the lower portion of the upper data pad region UDQR (e.g., in a vertical direction). The upper data pads UDQ1, UDQ3, UDQ5 and UDQ7 are arranged sequentially from the upper portion of the upper data pad region UDQR to the lower portion of the upper data pad region UDQR, and are arranged closer to the right side of the upper data pad region UDQR than to the left side of the upper data pad region UDQR (and thus, closer to the right side of the ×16 semiconductor memory chip 10-1 than to the left side of the ×16 semiconductor memory chip 10-1). The upper data pads UDQ1, UDQ3, UDQ5 and UDQ7 may be substantially aligned with one another from the upper portion of the upper data pad region UDQR to the lower portion of the upper data pad region UDQR (e.g., in a vertical direction).

Regarding arrangements of the upper data pads UDQ0 to UDQ7 of the ×16 semiconductor memory chip 10-1, referring to FIGS. 2A-2B, 3A-3B, 4A-4B, and 5, when fabricating the ×16 semiconductor memory chip 10-1 into the ×16, ×8, or ×4 semiconductor memory package 100-1, 100-2 or 100-3, the upper data pads UDQ0 to UDQ7, the upper data strobe signal pair pads UDQSB and UDQS, and the upper data mask signal pad UDM of the ×16 semiconductor memory chip 10-1 may be arranged to be adjacent in the same direction as the upper data balls DQU0 to DQU7, the upper data strobe signal pair balls DQSUB and DQSU, and the upper data mask signal ball DMU of the ×16 semiconductor memory package 100-1. Further, the upper data pads UDQ0 to UDQ7 of the ×16 semiconductor memory chip 10-1 may be arranged to be adjacent in the same direction as the data balls DQ0 to DQ7 or DQ0 to DQ3 of the ×8 or ×4 semiconductor memory package 100-2 or 100-3.

The ×16 semiconductor memory chip 10-1 may include lower data pads LDQ0 to LDQ7, lower data strobe signal pair pads LDQSB and LDQS, and a lower data mask signal pad LDM arranged in the lower data pad region LDQR. The lower data pads LDQ0 to LDQ7, the lower data strobe signal pair pads LDQSB and LDQS, and the lower data mask signal pad LDM may be used for the ×16 semiconductor memory package 100-1, and be used to transmit lower data, a lower data strobe signal pair, and a lower data mask signal. The lower data strobe signal pair pads LDQSB and LDQS may input and output the lower data strobe signal pair input and output together with the lower data. The lower data mask signal pad LDM may input the lower data mask signal for masking the lower data. Further, the lower data mask signal pad LDM may have a load connected to match a load with the lower data strobe signal pair pads LDQSB and LDQS, and the load may perform a signal termination function to terminate a signal input from the outside (e.g., from outside of the ×16 semiconductor memory chip 10-1).

As shown in FIG. 5, in an exemplary embodiment, the lower data strobe signal pair pads LDQSB and LDQS, and the lower data pads LDQ0, LDQ2, LDQ4 and LDQ6 are arranged in the left side in the lower data pad region LDQR. The lower data mask signal pad LDM, and the lower data pads LDQ1, LDQ3, LDQ5 and LDQ7 are arranged in the right side in the lower data pad region LDQR. Power pads are arranged between the lower data strobe signal pair pads LDQSB and LDQS, and the lower data pads LDQ0, LDQ2, LDQ4 and LDQ6, and between the lower data mask signal pad LDM and the lower data pads LDQ1, LDQ3, LDQ5 and LDQ7.

For example, in an exemplary embodiment, when viewed from a plan view, the lower data pads LDQ0, LDQ2, LDQ4 and LDQ6, and the lower data mask signal pad LDM are arranged sequentially from an upper portion of the lower data pad region LDQR to a lower portion of the lower data pad region LDQR, and are arranged closer to a left side of the lower data pad region LDQR than to a right side of the lower data pad region LDQR (and thus, closer to a left side of the ×16 semiconductor memory chip 10-1 than to a right side of the ×16 semiconductor memory chip 10-1). The lower data pads LDQ0, LDQ2, LDQ4 and LDQ6, and the lower data mask signal pad LDM may be substantially aligned with one another from the upper portion of the lower data pad region LDQR to the lower portion of the lower data pad region LDQR (e.g., in a vertical direction). The lower data pads LDQ1, LDQ3, LDQ5 and LDQ7 are arranged sequentially from the upper portion of the lower data pad region LDQR to the lower portion of the lower data pad region LDQR, and are arranged closer to the right side of the lower data pad region LDQR than to the left side of the lower data pad region LDQR (and thus, closer to the right side of the ×16 semiconductor memory chip 10-1 than to the left side of the ×16 semiconductor memory chip 10-1). The lower data pads LDQ1, LDQ3, LDQ5 and LDQ7 may be substantially aligned with one another from the upper portion of the lower data pad region LDQR to the lower portion of the lower data pad region LDQR (e.g., in a vertical direction).

Regarding arrangements of the lower data pads LDQ0 to LDQ7 of the ×16 semiconductor memory chip 10-1, referring FIGS. 2A-2B, 3A-3B, 4A-4B, and 5, when fabricating the ×16 semiconductor memory chip 10-1 into the ×16, ×8, or ×4 semiconductor memory package 100-1, 100-2 or 100-3, the lower data pads LDQ0 to LDQ7, the lower data strobe signal pair pads LDQSB and LDQS, and the lower data mask signal pad LDM of the ×16 semiconductor memory chip 10-1 may be arranged to be adjacent in the same direction as the lower data balls DQL0 to DQL7, the lower data strobe signal pair balls DQSLB and DQSL, and the lower data mask signal ball DML of the ×16 semiconductor memory package 100-1.

In an exemplary embodiment, the ×16 semiconductor memory chip 10-1 includes an inverted termination data strobe signal pad TDQSB, additional data strobe signal pair pads ADQSB and ADQS, and a data mask signal/termination data strobe signal pad DM/TDQS arranged in the additional pad region AR. The inverted termination data strobe signal pad TDQSB is used for the ×8 semiconductor memory package 100-2 (e.g., is used to electrically connect the ×16 semiconductor memory chip 10-1 to a PCB in the ×8 semiconductor memory package 100-2). The additional data strobe signal pair pads ADQSB and ADQS, and the data mask signal/termination data strobe signal pad DM/TDQS are used for the ×8 and ×4 semiconductor memory packages 100-2 and 100-3. The inverted termination data strobe signal pad TDQSB is connected to the upper data mask signal pad UDM arranged in the lower left side of the upper data pad region UDQR capable of performing a corresponding function by a signal line 12-2 inside the ×16 semiconductor memory chip 10-1. In an exemplary embodiment, the inverted termination data strobe signal pad TDQSB is internally connected to the upper data mask signal pad UDM. In an exemplary embodiment, the inverted termination data strobe signal pad TDQSB and the upper data mask signal pad UDM are disposed on a surface of the semiconductor memory chip 10-1, and the connection between the pads is made internally within the semiconductor memory chip 10-1.

In an exemplary embodiment, the inverted termination data strobe signal pad TDQSB is the first pad in the first column of pads in the upper data pad region UDQR, and the upper data mask signal pad UDM is the last pad in the first column of pads in the upper data pad region UDQR. Accordingly, the inverted termination data strobe signal pad TDQSB may transmit an extra inverted data strobe signal input from the outside for the ×8 semiconductor memory package 100-2 to the upper data mask signal pad UDM.

In an exemplary embodiment, the upper data mask signal pad UDM is not directly connected to the inverted termination data strobe signal ball TDQSB' of the ×8 semiconductor memory package 100-2, and does not terminate the extra inverted data strobe signal. The additional data strobe signal pair pads ADQSB and ADQS may be connected to the upper data strobe signal pair pads UDQSB and UDQS arranged in the upper right side in the upper data pad region UDQR capable of performing a corresponding function by signal lines 12-3 and 12-4 inside the ×16 semiconductor memory chip 10-1. Accordingly, the additional data strobe signal pair pads ADQSB and ADQS may transmit the data strobe signal pair input from the outside for the ×8 and ×4 semiconductor memory packages 100-2 and 100-3 to the upper data strobe signal pair pads UDQSB and UDQS. In an exemplary embodiment, the upper data strobe signal pair pads UDQSB and UDQS are not directly connected to the data strobe signal pair balls DQSB and DQS of the ×8 and ×4 semiconductor memory packages 100-2 and 100-3, and input the data strobe signal pair. The data mask signal/termination data strobe signal pad DM/TDQS may be connected to the lower data mask signal pad LDM arranged in the upper right side in the lower data pad region LDQR capable of performing a corresponding function by a signal line 12-5 inside the ×16 semiconductor memory chip 10-1. The data mask signal/termination data strobe signal pad DM/TDQS may transmit the data mask signal or the extra data strobe signal input from the outside for the ×8 and ×4 semiconductor memory packages 100-2 and 100-3 to the lower data mask signal pad LDM. In an exemplary embodiment, the lower data mask signal pad LDM is not directly connected to the data mask signal/termination data strobe signal ball DM'/TDQS' or the data mask signal ball DM' of the ×8 or ×4 semiconductor memory package 100-2 or 100-3, and does not input the data mask signal or terminate the extra data strobe signal.

The pads TDQSB, ADQSB, ADQS and DM/TQSB arranged in the additional pad region AR and the lines 12-2 to 12-5 may be formed in an upper layer of the internal circuit formed inside the ×16 semiconductor memory chip 10-1. The pads TDQSB, ADQSB, ADQS and DM/TQSB arranged in the additional pad region AR, and the lines 12-2 to 12-5 may be formed through, for example, a redistribution process.

As shown in FIG. 5, in an exemplary embodiment, the inverted termination data strobe signal pad TDQSB and the additional data strobe signal pair pads ADQSB and ADQS are arranged in the left side in the additional pad region AR. The data mask signal/termination data strobe signal pad DM/TDQS is arranged in the right side in the additional pad region AR. Power pads are arranged between the inverted termination data strobe signal pad TDQSB and the additional data strobe signal pair pads ADQSB and ADQS, and above and below the data mask signal/termination data strobe signal pad DM/TDQS.

According to exemplary embodiments, when pads are described as being arranged in the left side and the right side in the pad regions shown in FIG. 5, it is to be understood that the pads may be arranged in two columns (e.g., a left column and a right column). According to exemplary embodiments, the left and right columns in the adjacent pad regions (e.g., the additional pad region AR, the upper data pad region UDQR, and the lower data pad region LDQR) may be respectively aligned with one another, as shown in FIG. 5.

According to exemplary embodiments, the ×16 semiconductor memory chip 10-1 may include address and command signal pads, and power pads which are alternately arranged in two rows in an address and command signal pad region ACR. In FIG. 5, shaded/hatched pads represent power pads.

Regarding the inverted termination data strobe signal pad TDQSB of the additional pad region AR, referring to FIGS. 3A-3B and FIG. 5, when fabricating the ×16 semiconductor memory chip 10-1 into the ×8 semiconductor memory package 100-2, the inverted termination data strobe signal ball TDQSB' of the ×8 semiconductor memory package 100-2 may be arranged at the position where row A and column B intersect, but the upper data mask signal pad UDM of the ×16 semiconductor memory chip 10-1 capable of performing a function corresponding to the inverted termination data strobe signal ball TDQSB' of the ×8 semiconductor memory package 100-2 may be arranged in the lower side in the upper data pad region UDQR. Accordingly, since a distance between the inverted termination data strobe signal ball TDQSB' and the upper data mask signal pad UDM is increased, signal integrity may be decreased, and wirings in the PCB 20-2 may be difficult to configure (e.g., configuration of the wirings during fabrication may be difficult).

In an exemplary embodiment of the inventive concept, the configuration in which the inverted termination data strobe signal pad TDQSB is arranged in the upper left side of the additional pad region AR of the ×16 semiconductor memory chip 10-1 to be adjacent to the position where the inverted termination data strobe signal ball TDQSB' of the ×8 semiconductor memory package 100-2 is arranged, and in which the inverted termination data strobe signal pad TDQSB and the upper data mask signal pad UDM are connected by the line 12-2 inside the ×16 semiconductor memory chip 10-1, is provided. Accordingly, the inverted termination data strobe signal pad TDQSB shares a configuration of terminating the extra data strobe signal applied from the outside connected to the upper data mask signal pad UDM. Accordingly, a separate configuration for terminating the extra inverted data strobe signal for the inverted termination data strobe signal pad TDQSB inside the ×16 semiconductor memory chip 10-1 is not needed. Further, compared with a case in which a signal line connecting the inverted termination data strobe signal ball TDQSB' and the upper data mask signal pad UDM of the ×8 semiconductor memory package 100-2 is arranged in the PCB 20-2, the signal integrity may be improved, and the configuration of wirings in the PCB 20-2 may be improved (e.g., the ease of configuring the wirings during fabrication may be improved), since a length of the signal line is decreased.

Regarding the data mask signal/termination data strobe signal pad DM/TDQS of the additional pad region AR, referring to FIGS. 3A-3B, 4A-4B, an 5, when fabricating the ×16 semiconductor memory chip 10-1 into the ×8 or ×4 semiconductor memory package 100-2 or 100-3, the data mask signal/termination data strobe signal ball DM'/TDQS' or the data mask signal ball DM of the ×8 or ×4 semiconductor memory package 100-2 or 100-3 may be arranged at the position where row A and column 7 intersect, but the lower data mask signal pad LDM of the ×16 semiconductor memory chip 10-1 performing a function corresponding to the data mask signal/termination data strobe signal ball DM'/TDQS' or the data mask signal ball DM' of the ×8 or ×4 semiconductor memory package 100-2 or 100-3 may be arranged in the upper right side in the lower data pad region LDQR. Accordingly, since a distance between the data mask signal/termination data strobe signal ball DM'/TDQS' or the data mask signal ball DM' and the lower data mask signal pad LDM is increased, the signal integrity may be decreased, and configuring the wirings in the PCB 20-2 may be difficult.

In an exemplary embodiment of the inventive concept, the configuration in which the data mask signal/termination data strobe signal pad DM/TDQS is arranged in the right side of the additional pad region AR of the ×16 semiconductor memory chip 10-1 to be adjacent to a position where the data mask signal/termination data strobe signal ball DM'/TDQS' or the data mask signal ball DM' of the ×8 or ×4 semiconductor memory package 100-2 or 100-3 is arranged, and in which the data mask signal/termination data strobe signal pad DM/TDQS and the lower data mask signal pad LDM are connected by the line 12-5 inside the ×16 semiconductor memory chip 10-1, is provided. Accordingly, the data mask signal/termination data strobe signal pad DM/TDQS shares a configuration of inputting the lower data mask signal connected to the lower data mask signal pad LDM or terminating the extra data strobe signal. When fabricating the ×16 semiconductor memory chip 10-1 into the ×8 or ×4 semiconductor memory package 100-2 or 100-3, since data input through the upper data pads UDQ0 to UDQ7 of the ×16 semiconductor memory chip 10-1 is internally the lower data, the data mask signal input through the data mask signal/termination data strobe signal pad DM/TDQS connected to the lower data mask signal pad LDM is used for masking the lower data. Accordingly, a separate configuration of inputting the data mask signal for the data mask signal/termination data strobe signal pad DM/TDQS inside the ×16 semiconductor memory chip 10-1, or terminating the extra data strobe signal is not needed. Further, compared with a case in which the signal line connecting the data mask signal/termination data strobe signal ball DM'/TDQS' or the data mask signal ball DM' of the ×8 or ×4 semiconductor memory package 100-2 or 100-3 and the data mask signal/termination data strobe signal pad DM/TDQS of the ×16 semiconductor memory chip 10-1 is arranged in the PCBs 20-2 and 20-3, the signal integrity may be improved, and the configuration of wirings in the PCBs 20-2 and 20-3 may be improved (e.g., the ease of configuring the wirings during fabrication may be improved), since a length of the signal line is decreased.

Regarding the additional data strobe signal pair pads ADQSB and ADQS of the additional pad region AR, referring to FIGS. 3A-3B, 4A-4B, and 5, when fabricating the ×16 semiconductor memory chip 10-1 into the ×8 or ×4 semiconductor memory package 100-2 or 100-3, the data strobe signal pair balls DQSB and DQS of the ×8 or ×4 semiconductor memory package 100-2 or 100-3 may be arranged at the positions where rows B and C and column 3 intersect, but the upper data strobe signal pair pads UDQSB and UDQS of the ×16 semiconductor memory chip 10-1 performing a function corresponding to the data strobe signal pair balls DQSB and DQS of the ×8 or ×4 semiconductor memory package 100-2 or 100-3 may be arranged in the upper right side in the upper data region UDQR. Accordingly, arranging the signal lines passing between the pads in the PCBs 20-2 and 20-3 from the upper data strobe signal pair pads UDQSB and UDQS arranged in the right side to the data strobe signal pair balls DQSB and DQS arranged in the left side may be difficult.

In an exemplary embodiment of the inventive concept, the configuration in which the additional data strobe signal pair pads ADQSB and ADQS are further arranged in the left side of the additional pad region AR of the ×16 semiconductor memory chip 10-1 to be adjacent to the positions where the data strobe signal pair balls DQSB and DQS of the ×8 or ×4 semiconductor memory package 100-2 or 100-3 are arranged, and in which the upper data strobe signal pair pads UDQSB and UDQS and the additional data strobe signal pair pads ADQSB and ADQS are connected by the lines 12-3 and 12-4 inside the ×16 semiconductor memory chip 10-1, is provided. Accordingly, the additional data strobe signal pair pads ADQSB and ADQS share a configuration of inputting and outputting the upper data strobe signal connected to the upper data strobe signal pair pads UDQSB and UDQS. Accordingly, a separate configuration of inputting and outputting the data strobe signal pair for the additional data strobe signal pair pads ADQSB and ADQS inside the ×16 semiconductor memory chip 10-1 is not needed. Further, compared with a case in which the signal line connecting the data strobe signal pair balls DQSB and DQS of the ×8 and ×4 semiconductor memory packages 100-2 and 100-3 and the upper data strobe signal pair pads UDQSB and UDQS of the ×16 semiconductor memory chip 10-1 is arranged in the PCBs 20-2 and 20-3, the signal integrity may be improved, and configuration of the wirings in the PCBs 20-2 and 20-3 may be improved (e.g., the ease of configuring the wirings during fabrication may be improved) since a length of the signal line is decreased.

Figure 6A:
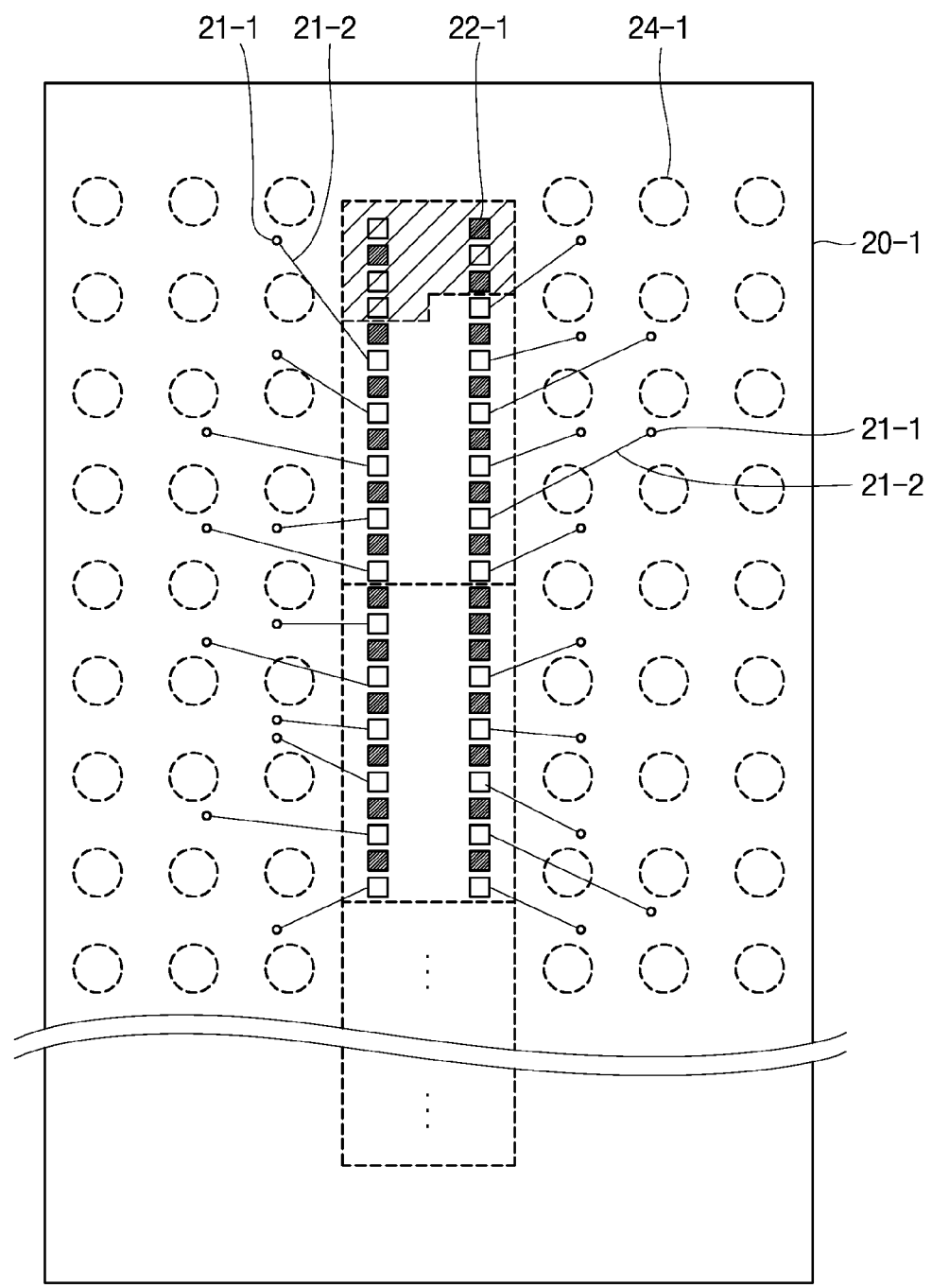
FIGS. 6A and 6B are conceptual diagrams illustrating line arrangements of a printed circuit board of a ×16 semiconductor memory package according to an exemplary embodiment of the inventive concept.
Figure 6B:
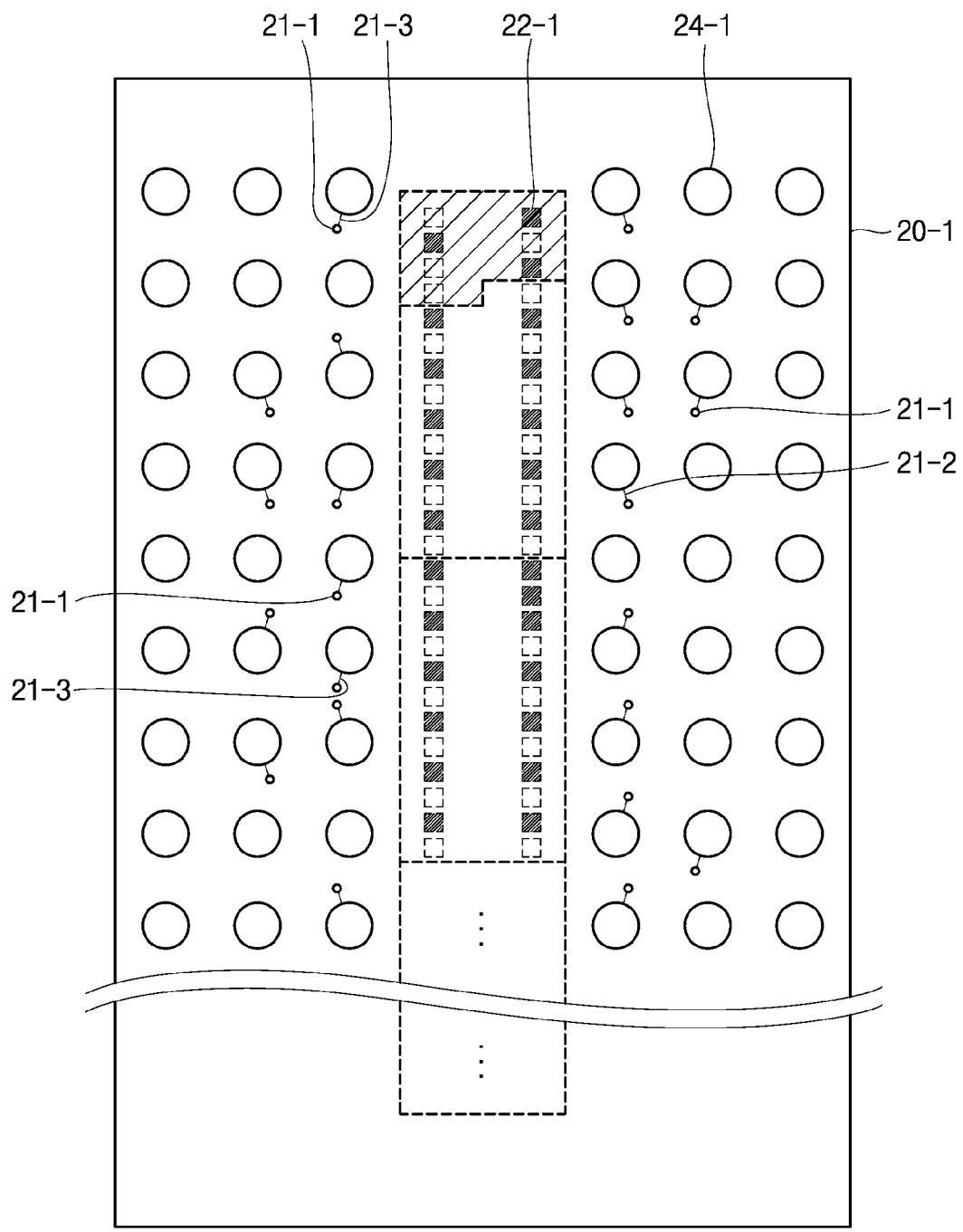

FIGS. 6A and 6B are conceptual diagrams illustrating line arrangements of the PCB 20-1 of the ×16 semiconductor memory package 100-1 according to an exemplary embodiment of the inventive concept. The PCB 20-1 may be, for example, a double-sided board or a board in which at least two layers are stacked.

Referring to FIGS. 2A and 2B, FIG. 5, and FIGS. 6A and 6B, when fabricating the ×16 semiconductor memory chip 10-1 into the ×16 semiconductor memory package 100-1, board pads arranged in a hatched region of the PCB 20-1 corresponding to the pads arranged in the additional pad region AR of the ×16 semiconductor memory chip 10-1 are not used in an exemplary embodiment, and thus, are not arranged (e.g., are not disposed thereon).

An example in which pads shown in FIGS. 6A and 6B represent board pads 22-1 arranged in the PCB 20-1, balls represent the balls 24-1 shown in FIG. 2A, and line arrangements for power pads are omitted, is illustrated. FIG. 6A illustrates arrangements of signal lines of an upper surface (or an upper layer) of a layer (or two or more layers) of the PCB 20-1, and FIG. 6B illustrates arrangements of signal lines of a lower surface (or a lower layer) of the layer (or the two or more layers) of the PCB 20-1.

Referring to FIG. 6A, the PCB 20-1 of the ×16 semiconductor memory package 100-1 includes the board pads 22-1 having the same arrangements as the pads of the ×16 semiconductor memory chip 10-1 in the upper surface, conductive vias 21-1 arranged to be adjacent to each of the balls 24-1 and penetrating the PCB 20-1, and first conductive lines 21-2 arranged in the upper surface (or the upper layer) and connecting corresponding board pads 22-1 and vias 21-1. Referring to FIG. 6B, the PCB 20-1 of the ×16 semiconductor memory package 100-1 further includes second conductive lines 21-3 arranged in the lower surface of the PCB 20-1 and connecting corresponding conductive vias 21-1 and balls 24-1.

As shown in FIGS. 6A and 6B, in an exemplary embodiment of the inventive concept, lengths of the signal lines are decreased since distances between the pads of the ×16 semiconductor memory chip 10-1 and the balls of the ×16 semiconductor memory package 100-1 are small. Thus, the signal integrity may be improved, and the configuration of the wirings in the PCB 20-1 may be improved (e.g., the ease of configuring the wirings during fabrication may be improved).

Figure 7A:
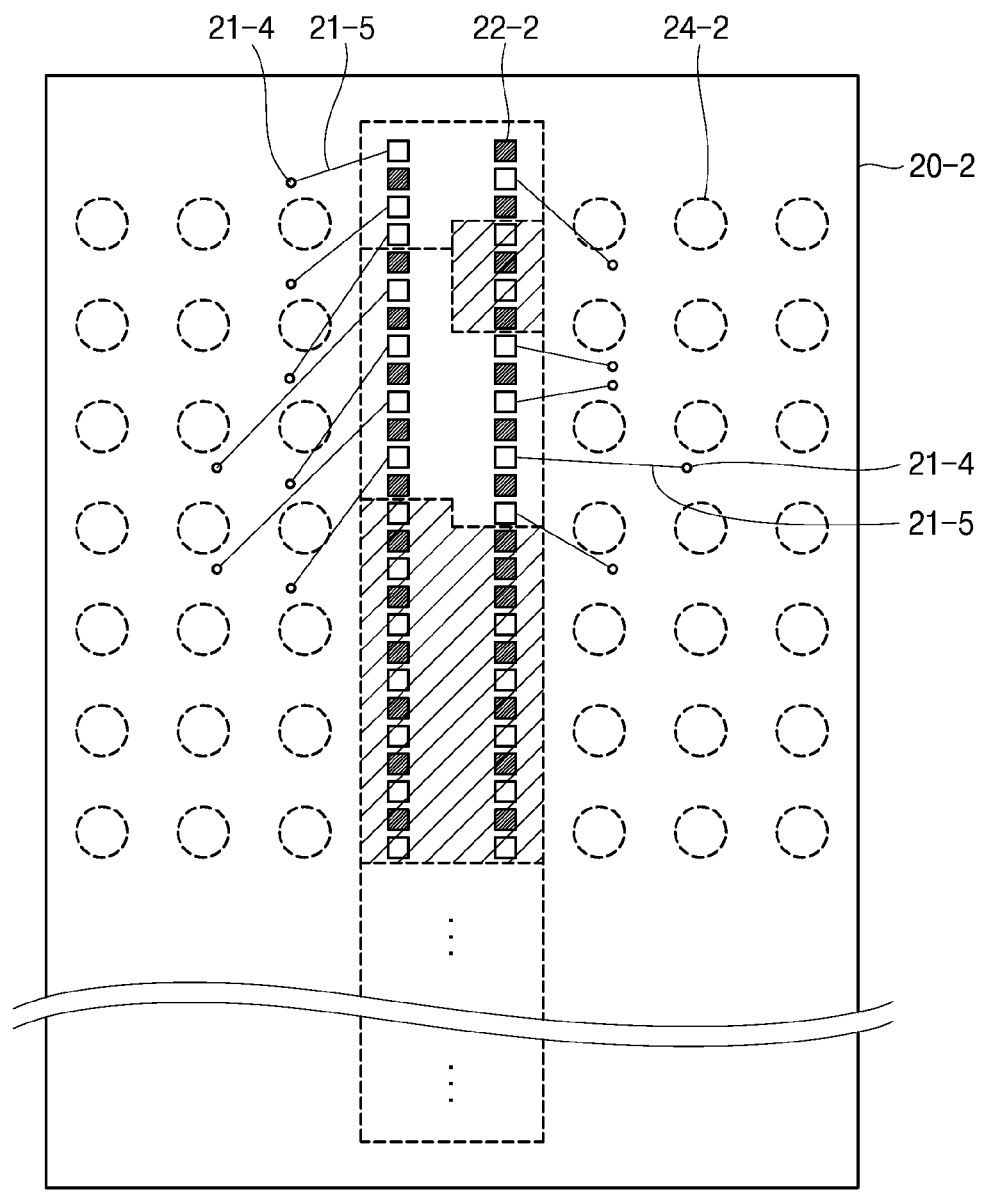
FIGS. 7A and 7B are conceptual diagrams illustrating line arrangements of a printed circuit board of a ×8 semiconductor memory package according to an exemplary embodiment of the inventive concept.
Figure 7B:
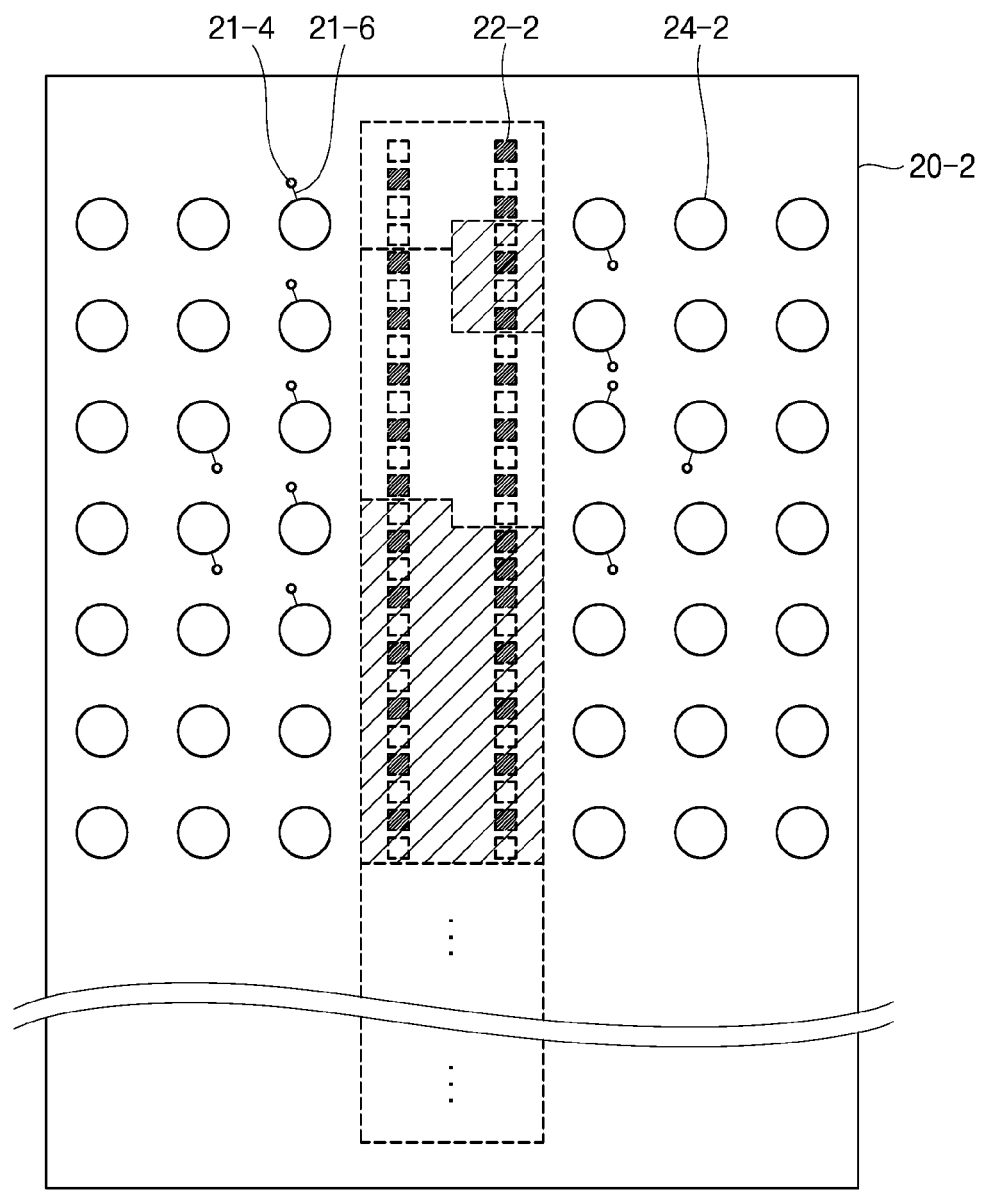

FIGS. 7A and 7B are conceptual diagrams illustrating line arrangements of the PCB 20-2 of the ×8 semiconductor memory package 100-2 according to an exemplary embodiment of the inventive concept.

Referring to FIGS. 3A and 3B, FIG. 5, and FIGS. 7A and 7B, when fabricating the ×16 semiconductor memory chip 10-1 into the ×8 semiconductor memory package 100-2, board pads in the hatched region of the PCB 20-2 of the ×16 semiconductor memory chip 10-1 are not used in an exemplary embodiment, and thus, are not arranged (e.g., are not disposed thereon).

An example in which pads shown in FIGS. 7A and 7B represent board pads 22-2 arranged in the PCB 20-2, balls represent the balls 24-2 shown in FIG. 3A, and line arrangements for power pads are omitted, is illustrated. FIG. 7A illustrates arrangements of signal lines of an upper surface (or an upper layer) of a layer (or two or more layers) of the PCB 20-2, and FIG. 7B illustrates arrangements of signal lines of a lower surface (or a lower layer) of the layer (or the two or more layers) of the PCB 20-2.

Referring to FIG. 7A, the PCB 20-2 of the ×8 semiconductor memory package 100-2 includes the board pads 22-2 having the same arrangements as the pads of the ×16 semiconductor memory chip 10-1 in the upper surface, conductive vias 21-4 arranged to be adjacent to each of the balls 24-2 and penetrating the PCB 20-2, and first conductive lines 21-5 arranged in the upper surface and connecting corresponding board pads 22-2 and the conductive vias 21-4. Referring to FIG. 7B, the PCB 20-2 of the ×8 semiconductor memory package 100-2 further includes second conductive lines 21-6 arranged in the lower surface of the PCB 20-2 and connecting corresponding conductive vias 21-4 and balls 24-2.

Referring to FIGS. 6A and 7A, in an exemplary embodiment, lengths of the lines 21-2 of the PCB 20-1 and lengths of the lines 21-5 of the PCB 20-2 are substantially the same. Accordingly, since distances between the pads of the ×16 semiconductor memory chip 10-1 and the balls of the ×8 semiconductor memory package 100-2 are maintained to be close, the signal integrity may be improved. Further, configuration of the wirings in the PCB 20-2 may be improved (e.g., the ease of configuring the wirings during fabrication may be improved).

Figure 8A:
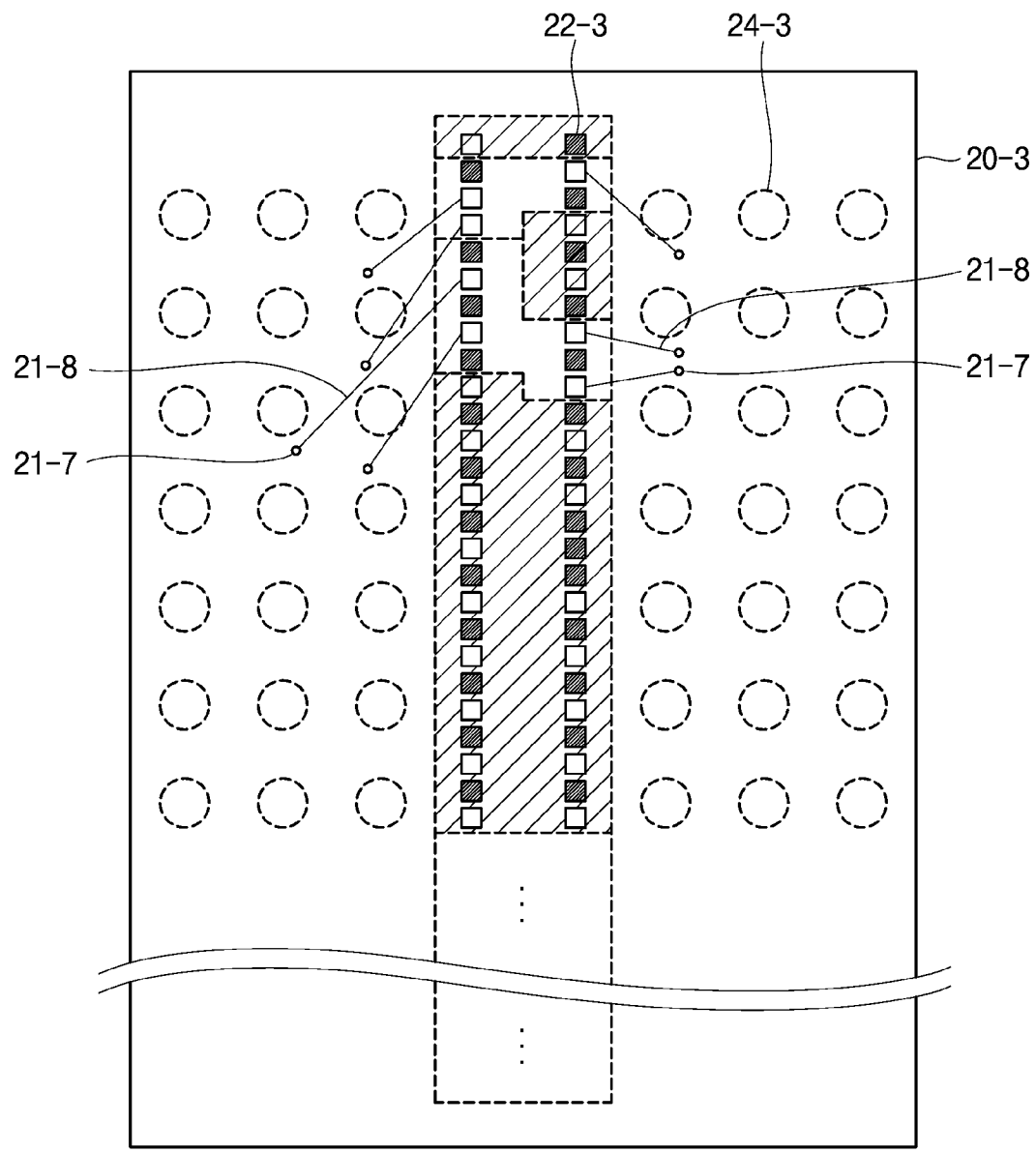
FIGS. 8A and 8B are conceptual diagrams illustrating line arrangements of a printed circuit board of a ×4 semiconductor memory package according to an exemplary embodiment of the inventive concept.
Figure 8B:
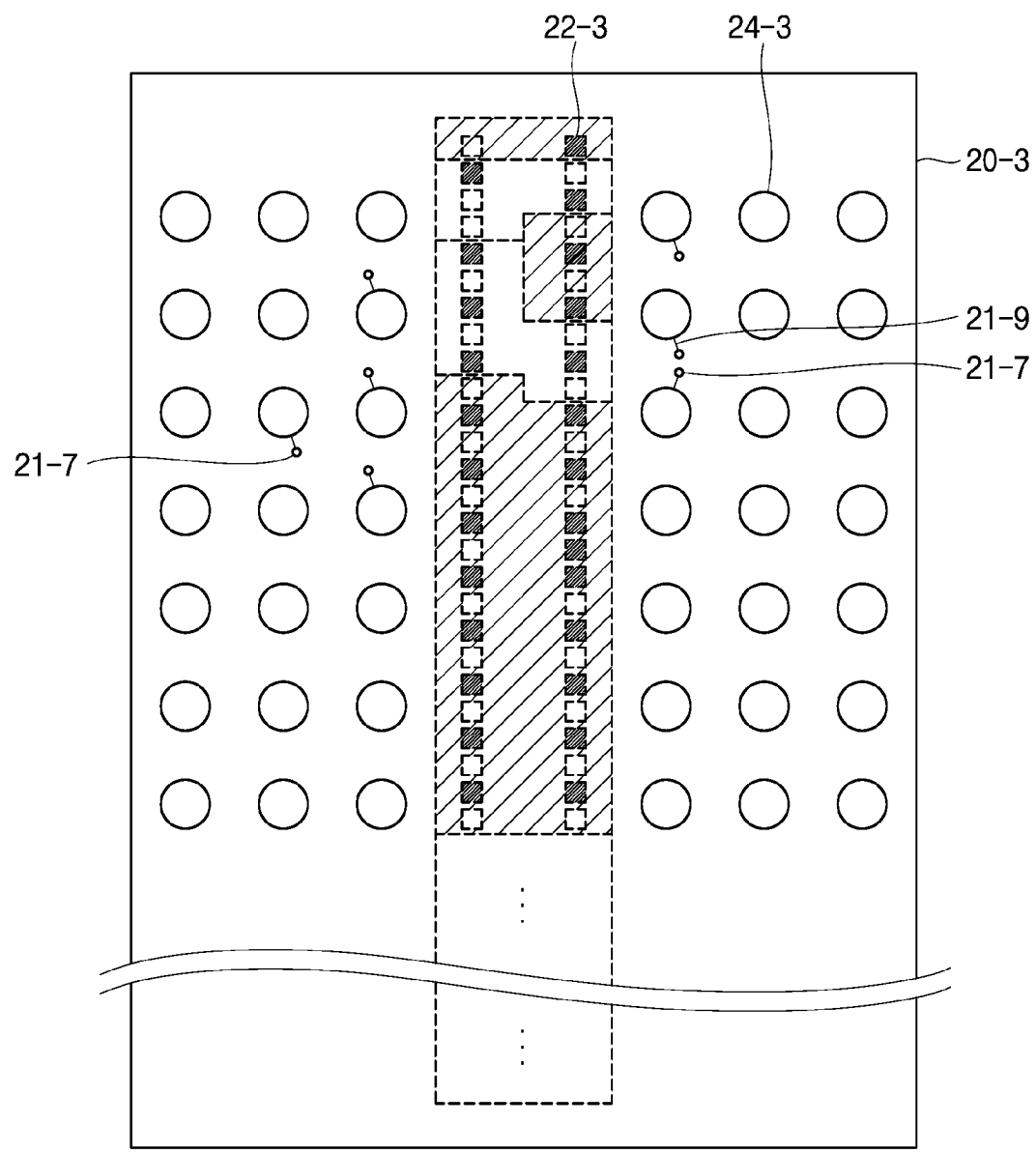

FIGS. 8A and 8B are conceptual diagrams illustrating line arrangements of the PCB 20-3 of the ×4 semiconductor memory package 100-3 according to an exemplary embodiment of the inventive concept. The PCB 20-3 may be, for example, a double-sided board or a board in which at least two layers are stacked.

Referring to FIGS. 4A and 4B, FIG. 5, and FIGS. 8A and 8B, when fabricating the ×16 semiconductor memory chip 10-1 into the ×4 semiconductor memory package 100-3, the board pads in the hatched region of the PCB 20-3 of the ×16 semiconductor memory chip 10-1 are not used in an exemplary embodiment, and thus, are not arranged (e.g., are not disposed thereon).

An example in which pads shown in FIGS. 8A and 8B represent board pads 22-3 arranged in the PCB 20-3, balls represent the balls 24-3 shown in FIG. 4A, and line arrangements for power pads are omitted, is illustrated. FIG. 8A illustrates line arrangements of an upper surface (or an upper layer) of the layer (or the two or more layers) of the PCB 20-3, and FIG. 8B illustrates arrangements of signal lines of a lower surface (or a lower layer) of the layer (or the two or more layers) of the PCB 20-3.

Referring to FIG. 8A, the PCB 20-3 of the ×4 semiconductor memory package 100-3 includes the board pads 22-3 having the same arrangements as the pads of the ×16 semiconductor memory chip 10-1 in the upper surface, conductive vias 21-7 arranged to be adjacent to each of the balls 24-3 and penetrating the PCB 20-3, and first conductive lines 21-8 arranged in the upper surface and connecting corresponding pads 22-3 and conductive vias 21-7. Referring to FIG. 8B, the PCB 20-3 of the ×4 semiconductor memory package 100-3 further includes second conductive lines 21-9 arranged in the lower surface of the PCB 20-3 and connecting corresponding conductive vias 21-7 and balls 24-3.

Similar to the arrangements of the PCB 20-2 shown in FIG. 7A, since distances between the pads of the ×16 semiconductor memory chip 10-1 and the balls of the ×4 semiconductor memory package 100-3 are maintained to be close, the signal integrity may be improved. Further, configuration of the wirings in the PCB 20-3 may be improved (e.g., the ease of configuring the wirings during fabrication may be improved).

According to an exemplary embodiment, board address and command signal pads of the PCBs 20-1, 20-2 and 20-3 may be arranged at positions corresponding to the address and command signal pads of the ×16 semiconductor memory chip 10-1, and the board address and command signal pads of the PCBs 20-1, 20-2 and 20-3 may be connected to corresponding address and command signal balls of the semiconductor memory packages 100-1, 100-2 and 100-3.

Figure 9:
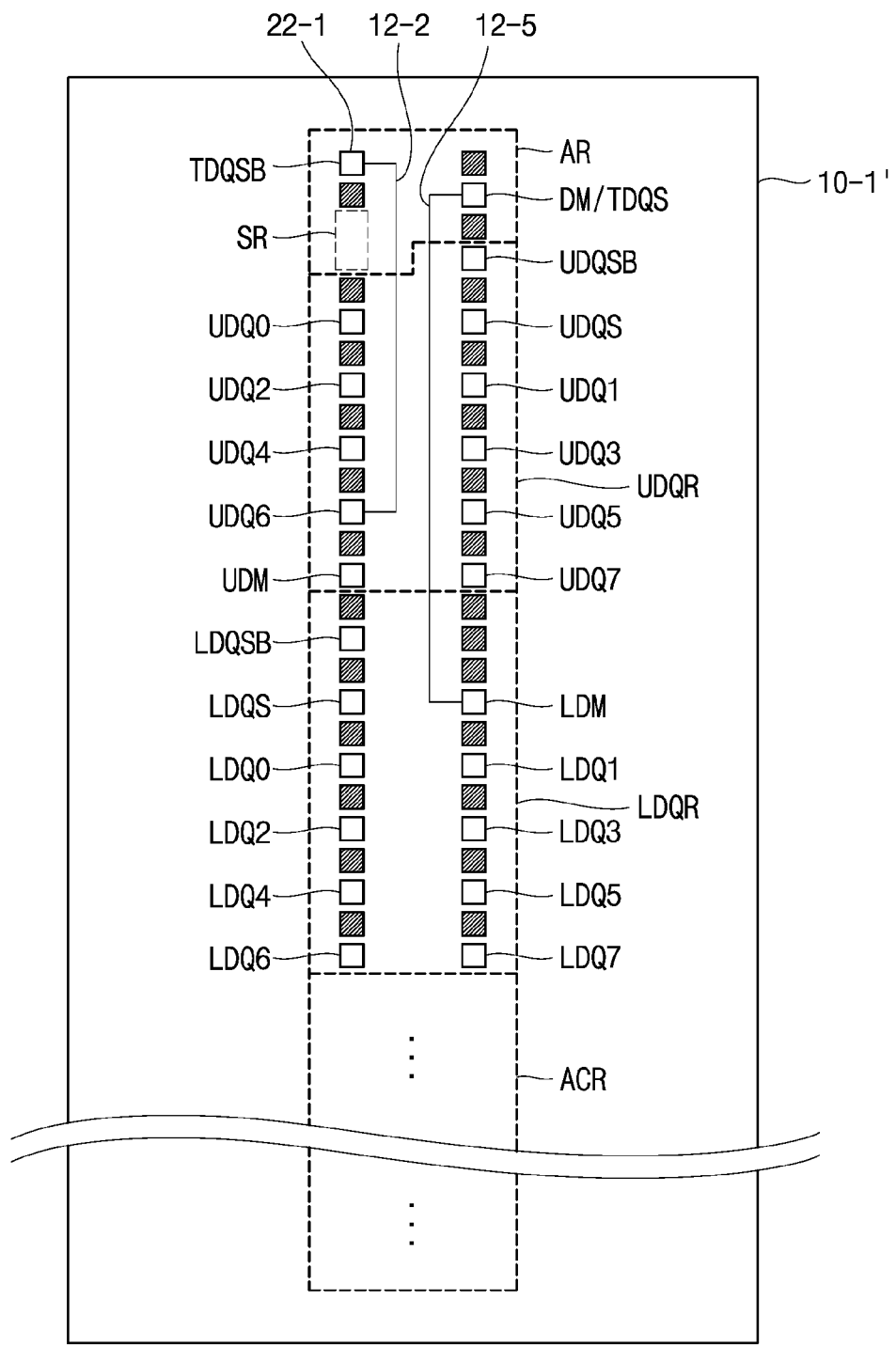
FIG. 9 is a diagram illustrating pad arrangements of a ×16 semiconductor memory chip according to an exemplary embodiment of the inventive concept.

FIG. 9 is a diagram illustrating pad arrangements of a ×16 semiconductor memory chip 10-1' according to an exemplary embodiment of the inventive concept.

Referring to FIGS. 5 and 9, the ×16 semiconductor memory chip 10-1' shown in FIG. 9 does not include the additional data strobe signal pair pads ADQSB and ADQS arranged in the additional pad region AR of the ×16 semiconductor memory chip 10-1 shown in FIG. 5. Further, the ×16 semiconductor memory chip 10-1' shown in FIG. 9 does not include the signal lines 12-3 and 12-4 for connecting the additional data strobe signal pair pads ADQSB and ADQS and the upper data strobe signal pair pads UDQSB and UDQS. Accordingly, the ×16 semiconductor memory chip 10-1' shown in FIG. 9 includes an empty region SR instead of the additional pad region AR.

Since the ×16 semiconductor memory chip 10-1' shown in FIG. 9 is similar to the ×16 semiconductor memory chip 10-1 shown in FIG. 5, other than the differences described above, a further description of the ×16 semiconductor memory chip 10-1' shown in FIG. 9 is herein omitted.

The lines of the PCB 20-1 of the ×16 semiconductor memory package 100-1 according to an exemplary embodiment of the inventive concept has the same arrangements as the lines shown in FIGS. 6A and 6B.

Figure 10:
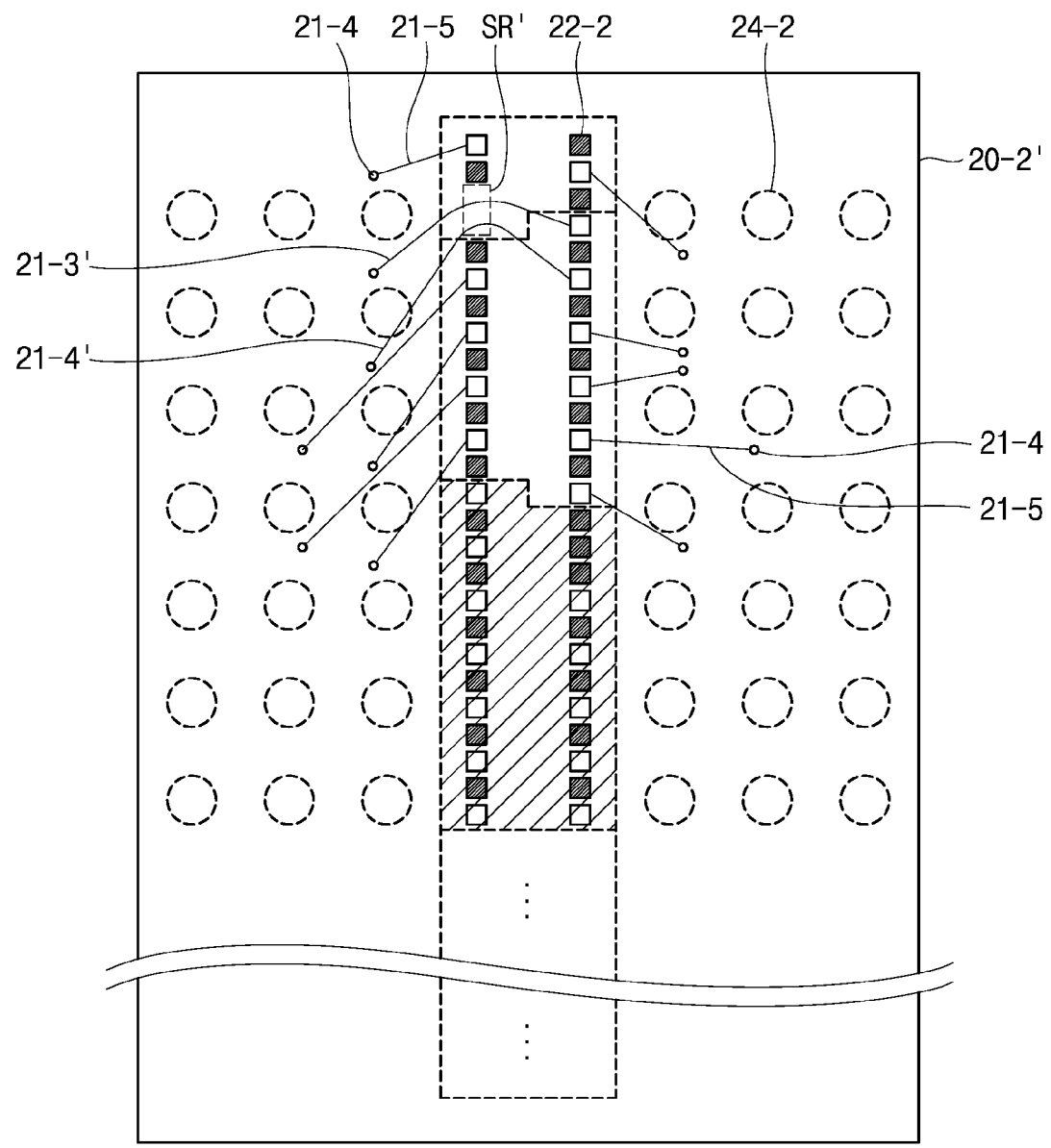
FIG. 10 is a conceptual diagram illustrating line arrangements of a printed circuit board of a ×8 semiconductor memory package according to an exemplary embodiment of the inventive concept.

FIG. 10 is a conceptual diagram illustrating line arrangements of a PCB 20-2' of the ×8 semiconductor memory package 100-2 according to an exemplary embodiment of the inventive concept. The PCB 20-2' may be, for example, a double-sided board or a board in which at least two or more layers are stacked.

The line arrangements of the PCB 20-2' of the ×8 semiconductor memory package 100-2 according to the exemplary embodiment shown in FIG. 10 is similar to the exemplary embodiment shown in FIGS. 7A and 7B. Thus, a description of elements and configurations previously described is omitted herein. Referring to the exemplary embodiment of FIG. 10, unlike the exemplary embodiment of FIGS. 7A and 7B, the additional data strobe signal line pair pads ADQSB and ADQS are not arranged (e.g., are not disposed thereon). Thus, the upper data strobe signal pair pads UDQSB and UDQS of the ×16 semiconductor memory chip 10-1' and the data strobe signal pair balls DQSB and DQS of the ×8 semiconductor memory package 100-2 are connected by lines 21-3' and 21-4' passing a board empty region SR' arranged in an upper surface of the PCB 20-2'. In an exemplary embodiment, lines of a lower surface of the PCB 20-2' may have the same arrangements as the lines shown in FIG. 7B.

According to an exemplary embodiment of the inventive concept, the empty region SR is obtained by removing the upper data strobe signal pair pads ADQSB and ADQS of the additional pad region AR of the ×16 semiconductor memory chip 10-1 shown in FIG. 5, and conductive lines 21-3' and 21-4' are arranged to the left of the upper data strobe signal pair pads UDQSB and UDQS through the board empty region SR' of the PCB 20-2' positioned at a position corresponding to the empty region SR. Accordingly, configuration of the wirings in the PCB 20-2' may be improved (e.g., the ease of configuring the wirings during fabrication may be improved).

Line arrangements of a PCB of the ×4 semiconductor memory package 100-3 according to an exemplary embodiment of the inventive concept will be described by referring to FIGS. 8A, 8B and 10, and a further description of elements and configurations previously described will be omitted herein.

As described above, the ×16 semiconductor memory chip according to exemplary embodiments of the inventive concept have an improved pad arrangements configuration capable of securing improved signal integrity, while satisfying all of the ball arrangements of the ×16 semiconductor memory package, the ball arrangements of the ×8 semiconductor memory package, and the ball arrangements of the ×4 semiconductor memory package. Further, the semiconductor memory packages according to exemplary embodiments of the inventive concept result in an improvement in the convenience of configuring the wirings in the PCB (e.g., the ease of configuring the wirings during fabrication is improved).

In exemplary embodiments of the inventive concept, the semiconductor memory chips 10-1 and 10-1' have a configuration in which at least one pad of the inverted termination data strobe signal pad TDQSB and the data mask signal/termination data strobe signal pad DM/TDQS arranged in the additional pad region AR is internally connected to a corresponding upper data mask signal pad UDM and lower data mask signal pad LDM.

Although the examples described herein refer to a configuration in which the number of bits of the upper data and the number of bits of the lower data are the same, exemplary embodiments of the inventive concept are not limited thereto. For example, in exemplary embodiments, the number of bits of the upper data and the number of bits of the lower data may be different from each other.

Although the examples described herein refer to a semiconductor memory chip capable of inputting and outputting 16-bit data, exemplary embodiments of the inventive concept are not limited thereto. For example, exemplary embodiments of the inventive concept may be applied to a semiconductor memory chip capable of inputting and outputting more than 16-bit data.

Although the examples described herein refer to fabricating a semiconductor memory package using one semiconductor memory chip, exemplary embodiments of the inventive concept are not limited thereto. For example, exemplary embodiments of the inventive concept may be applied when fabricating one semiconductor memory package by stacking two or more semiconductor memory chips. Further, exemplary embodiments of the inventive concept may be applied when fabricating one semiconductor memory package by stacking two or more semiconductor memory packages.

Figure 11:
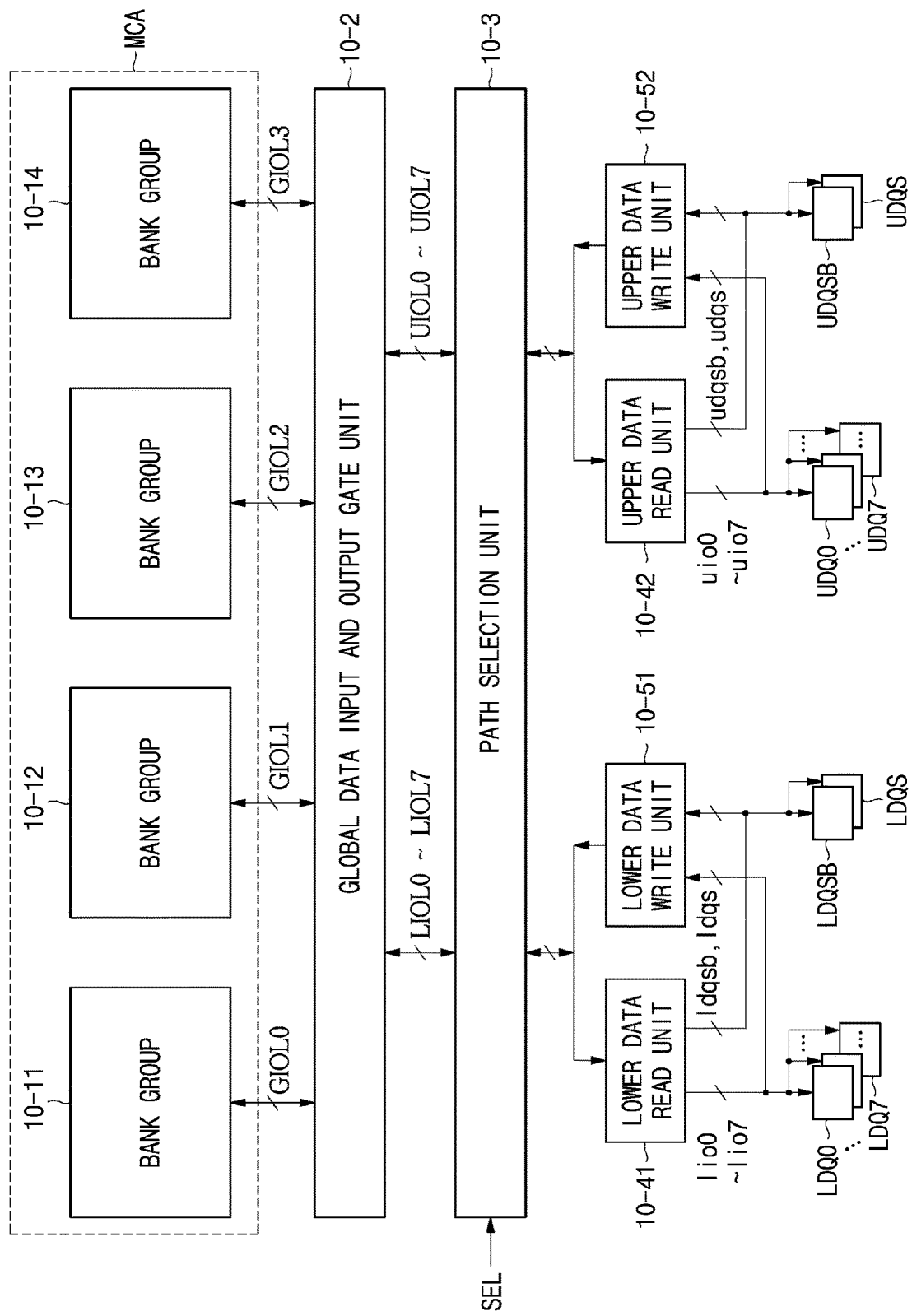
FIG. 11 is a block diagram illustrating a configuration of an internal circuit of a semiconductor memory chip according to an exemplary embodiment of the inventive concept.

FIG. 11 is a block diagram illustrating a configuration of an internal circuit of a semiconductor memory chip according to an exemplary embodiment of the inventive concept. The semiconductor memory chips 10-1 and 10-1' may include a memory cell array MCA including bank groups 10-11, 10-12, 10-13 and 10-14, a global data input and output gate unit 10-2, a path selection unit 10-3, lower and upper data read units 10-41 and 10-42, and lower and upper data write units 10-51 and 10-52. Each of the bank groups 10-11, 10-12, 10-13, and 10-14 may include four memory banks, however the bank groups are not limited thereto. All of the units described herein may be implemented as circuits.

A function of each of the components shown in FIG. 11 will be described.

Each of the bank groups 10-11, 10-12, 10-13, and 10-14 may input and output data through corresponding global data input and output lines GIOL0 to GIOL3. For the ×16 semiconductor memory package 100-1, two of the bank groups 10-11, 10-12, 10-13, and 10-14 may be simultaneously selected, and input and output 16n-bit (n may be 8) data. For the ×8 and ×4 semiconductor memory packages 100-2 and 100-3, one of the bank groups 10-11, 10-12, 10-13, and 10-14 may be selected, and input and output 8n-bit and 4n-bit (n may be 8) data.

The global data input and output gate unit 10-2 may transmit data between the global data input and output lines GIOL0 to GIOL3 and lower and upper data lines LIOL0 to LIOL7, and UIOL0 to UIOL7 for the ×16, ×8 and ×4 semiconductor memory packages 100-1, 100-2, and 100-3. The global data input and output gate unit 10-2 may input 16n-bit data transmitted through the global data input and output lines GIOL0 to GIOL3, sequentially transmit 8-bit lower data to the lower data lines LIOL0 to LIOL7, and sequentially transmit 8-bit upper data to the upper data lines UILO0 to UILO3, during a read operation for the ×16 semiconductor memory package 100-1. The global data input and output gate unit 10-2 may sequentially input the lower data transmitted through the lower data lines LIOL0 to LIOL7 and the upper data transmitted through the upper data lines UIOL0 to UIOL7, and transmit 16n-bit data to the global data input and output lines GIOL0 to GIOL3, during a write operation for the ×16 semiconductor memory package 100-1. The global data input and output gate unit 10-2 may input 8n-bit or 4n-bit lower data transmitted through the global data input and output lines GIOL0 to GIOL3, and transmit the 8n-bit or 4n-bit lower data to the lower data lines LIOL0 to LIOL7 or LIOL0 to LIOL3 during a read operation for the ×8 or ×4 semiconductor memory package 100-2 or 100-3. The global data input and output gate unit 10-2 may sequentially input the lower data transmitted through the lower data lines LIOL0 to LIOL7 and LIOL0 to LIOL3, and transmit 8n-bit or 4n-bit data to the global data input and output lines GIOL0 to GIOL3 during a write operation for the ×8 or ×4 semiconductor memory package 100-2 or 100-3.

Referring to the ×16 semiconductor memory package 100-1, the path selection unit 10-3 may transmit the lower data to the lower data read unit 10-41 and transmit the upper data to the upper data read unit 10-42 during the read operation, and transmit data transmitted from the lower data write unit 10-51 to the lower data lines LIOL0 to LIOL7 and transmit data transmitted from the upper data write unit 10-52 to the upper data lines UIOL0 to UIOL7 during the write operation. Referring to the ×8 and ×4 semiconductor memory packages 100-2 and 100-3, the path selection unit 10-3 may transmit the lower data to the upper data read unit 10-42 during the read operation, and transmit data transmitted from the upper data write unit 10-52 to the lower data lines LIOL0 to LIOL7 during the write operation. A selection signal (SEL) applied to the path selection unit 10-3 may be set to have states different from each other for the ×16 semiconductor memory package 100-1, and the ×8 and ×4 semiconductor memory packages 100-2 and 100-3 using a mode register setting operation, or using a fuse program when fabricating the ×8 and ×4 semiconductor memory packages 100-2 and 100-3.

The lower data read unit 10-41 may drive the lower data transmitted from the path selection unit 10-3 for the ×16 semiconductor memory package 100-1, generate data lio0 to lio7 and a lower data strobe signal pair ldqsb and ldqs, and transmit the data lio0 to lio7 and the lower data strobe signal pair ldqsb and ldqs to the lower data pads LDQ0 to LDQ7 and the lower data strobe signal pair pads LDQSB and LDQS.

The upper data read unit 10-42 may drive the upper data transmitted from the path selection unit 10-3 for the ×16 semiconductor memory package 100-1, generate data uio0 to uio7 and an upper data strobe signal pair udqsb and udqs, and transmit the data uio0 to uio7 and the upper data strobe signal pair udqsb and udqs to the upper data pads UDQ0 to UDQ7 and the upper data strobe signal pair pads UDQSB and UDQS, for the ×16 semiconductor memory package 100-1, and drive the lower data transmitted from the path selection unit 10-3, generate the data uio0 to uio7 or uio0 to uio4 and the upper data strobe signal pair udqsb and udqs, and transmit the data uio0 to uio7 or uio0 to uio4 and the upper data strobe signal pair udqsb and udqs to the upper data pads UDQ0 to UDQ7 and the upper data strobe signal pair pads UDQSB and UDQS, for the ×8 and ×4 semiconductor memory packages 100-2 and 100-3.

Referring to the ×16 semiconductor memory package 100-1, the lower data write unit 10-51 may input and drive the lower data and the lower data strobe signal pair input through the lower data pads LDQ0 to LDQ7 and the lower data strobe signal pair pads LDQSB and LDQS, and output the lower data and the lower data strobe signal pair to the path selection unit 10-3.

Referring to the ×16 semiconductor memory package 100-1, the upper data write unit 10-52 may input and drive the upper data and the upper data strobe signal pair input through the upper data pads UDQ0 to UDQ7 and the upper data strobe signal pair pads UDQSB and UDQS, and transmit the upper data and the upper data strobe signal pair to the path selection unit 10-3. Referring to the ×8 and ×4 semiconductor memory packages 100-2 and 100-3, the upper data write unit 10-52 may input and drive data and data strobe signal pair input through the upper data pads UDQ0 to UDQ7 and the upper data strobe signal pair pads UDQSB and UDQS, and transmit the data and the data strobe signal pair to the path selection unit 10-3.

Accordingly, referring to the ×16 semiconductor memory package 100-1, the semiconductor memory chip according to an exemplary embodiment of the inventive concept may output the upper data transmitted to the upper data lines UIOL0 to UIOL7 through the path selection unit 10-3, the upper data read unit 10-42, and the upper data pads UDQ0 to UDQ7 during the read operation. Referring to the ×8 and ×4 semiconductor memory packages 100-2 and 100-3, the semiconductor memory chip according to an exemplary embodiment of the inventive concept may output the lower data transmitted to the lower data lines LIOL0 to LIOL7 through the path selection unit 10-3, the upper data read unit 10-42, and the upper data pads UDQ0 to UDQ7 during the read operation.

Referring to the ×16 semiconductor memory package 100-1, the semiconductor memory chip according to an exemplary embodiment of the inventive concept may transmit data input from the outside to the upper data lines UIOL0 to UIOL7 through the upper data pads UDQ0 to UDQ7, the upper data write unit 10-52, and the path selection unit 10-3 during the write operation. Referring to the ×8 or ×4 semiconductor memory package 100-2 or 100-3, the semiconductor memory chip according to an exemplary embodiment of the inventive concept may transmit the data input from the outside to the lower data lines LIOL0 to LIOL7 or LIOL0 to LIOL3 through the upper data pads UDQ0 to UDQ7, the upper data write unit 10-52, and the path selection unit 10-3 during the write operation.

Figure 12:
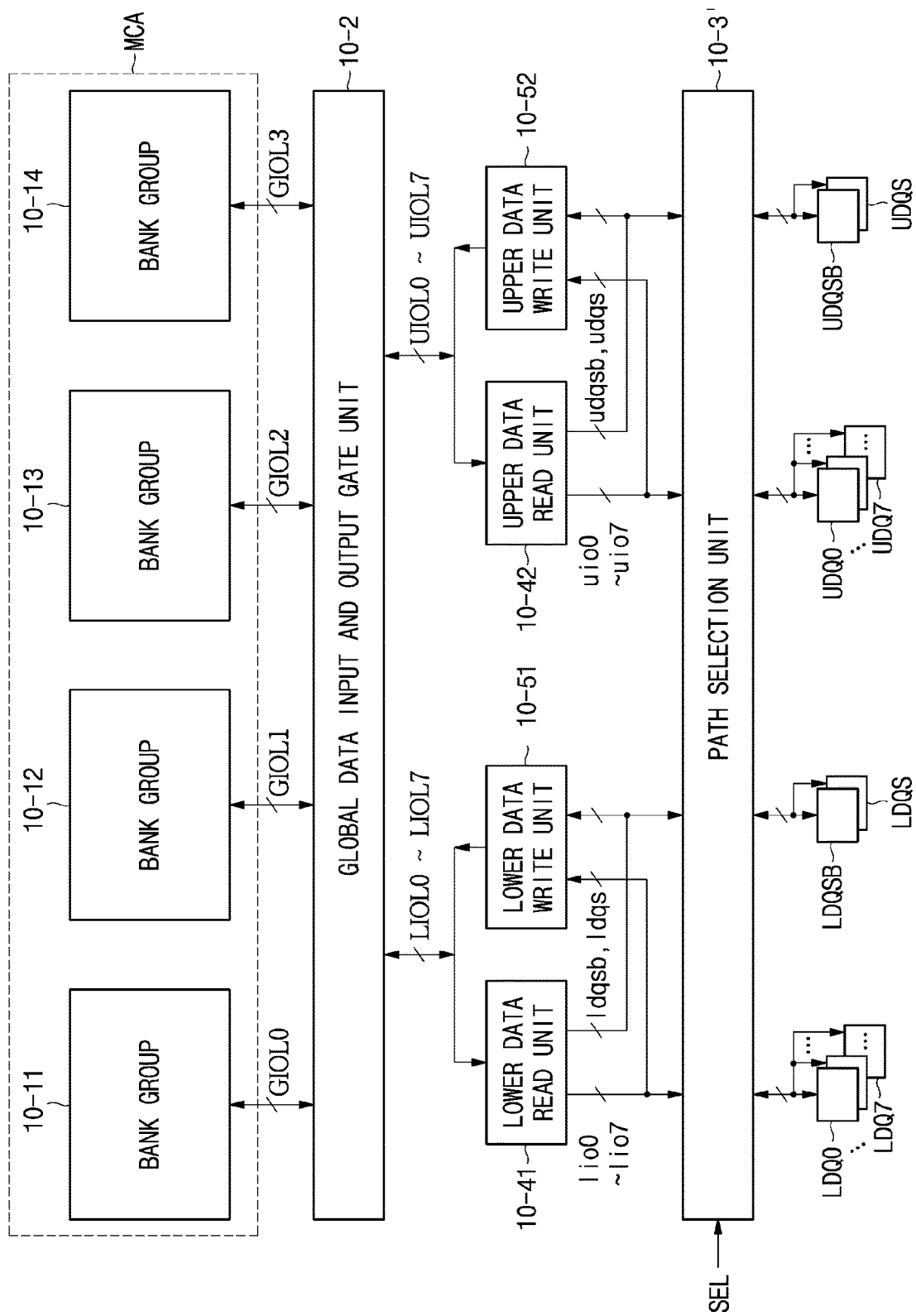
FIG. 12 is a block diagram illustrating a configuration of an internal circuit of a semiconductor memory chip according to an exemplary embodiment of the inventive concept.

FIG. 12 is a block diagram illustrating a configuration of an internal circuit of a semiconductor memory chip according to an exemplary embodiment of the inventive concept. An internal circuit of the semiconductor memory chip shown in FIG. 12 includes a configuration in which a path selection unit 10-3' is connected between the lower and upper data read units 10-41 and 10-42 and the lower and upper data write units 10-51 and 10-52, and the lower and upper data pads LDQ0 to LDQ7 and UDQ0 to UDQ7 and the lower and upper data strobe signal pair pads LDQSB, LDQS, UDQSB, and UDQS, instead of the path selection unit 10-3 of the internal circuit of the semiconductor memory chip according to the exemplary embodiment of the inventive concept shown in FIG. 11.

A further description of the components having the same reference numerals among the components shown in FIG. 12 that were previously described with reference to FIG. 11 is omitted herein. A function of the path selection unit 10-3' will be described.

Referring to the ×16 semiconductor memory package 100-1, the path selection unit 10-3' may transmit the data lio0 to lio7 and the lower data strobe signal pair ldqsb and ldqs output from the lower data read unit 10-41 to the lower data pads LDQ0 to LDQ7 and the lower data strobe signal pair pads LDQSB and LDQS, and transmit the data uio0 to uio7 and the upper data strobe signal pair udqsb and udqs output from the upper data read unit 10-42 to the upper data pads UDQ0 to UDQ7 and the upper data strobe signal pair pads UDQSB and UDQS, during the read operation. Referring to the ×16 semiconductor memory package 100-1, the path selection unit 10-3' may transmit the lower data and the lower data strobe signal pair input through the lower data pads LDQ0 to LDQ7 and the lower data strobe signal pair pads LDQSB and LDQS to the lower data write unit 10-51, and transmit the upper data and the upper data strobe signal pair input through the upper data pads UDQ0 to UDQ7 and the upper data strobe signal pair pads UDQSB and UDQS to the upper data write unit 10-52, during the write operation. Referring to the ×8 and ×4 semiconductor memory packages 100-2 and 100-3, the path selection unit 10-3' may transmit the data lio0 to lio7 and the lower data strobe signal pair ldqsb and ldqs output from the lower data read unit 10-41 to the upper data pads UDQ0 to UDQ7 and the upper data strobe signal pair pads UDQSB and UDQS, during the read operation. Referring to the ×8 and ×4 semiconductor memory packages 100-2 and 100-3, the path selection unit 10-3' may transmit data and the data strobe signal pair input through the upper data pads UDQ0 to UDQ7 and the upper data strobe signal pair pads UDQSB and UDQS to the lower data write unit 10-51, during the write operation. The selection signal SEL may be set by the method described above with reference to FIG. 11.

Since the semiconductor memory chip according to an exemplary embodiment of the inventive concept shown in FIG. 11 is configured to input and output the data through the upper data read unit 10-42 and the upper data write unit 10-52 designed to be adjacent to the upper data pads UDQ0 to UDQ7 and the upper data strobe signal pair pads UDQSB and UDQS, the signal integrity may be further improved compared with the semiconductor memory chip according to an exemplary embodiment of the inventive concept shown in FIG. 12.

Figure 13:
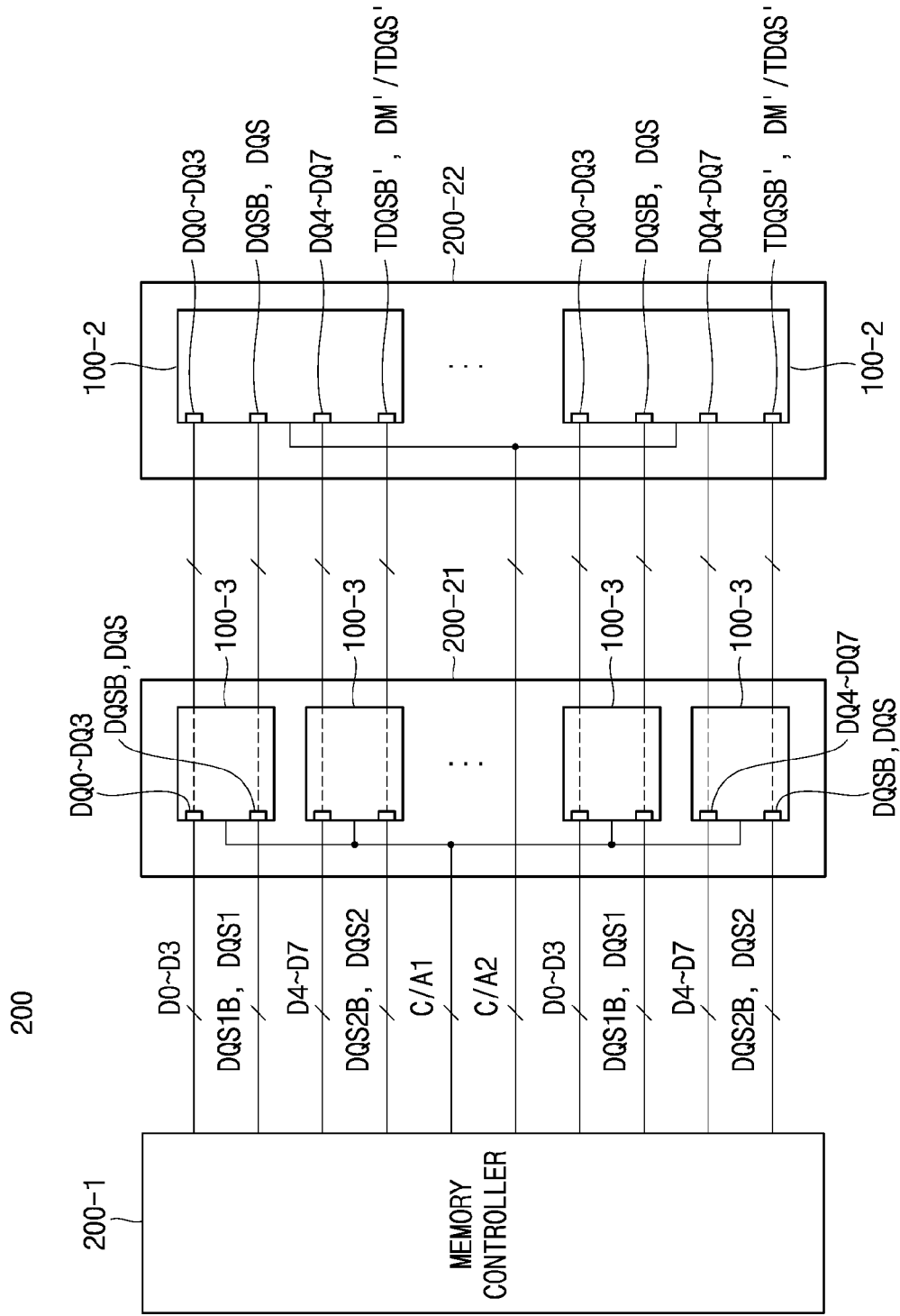
FIG. 13 is a block diagram illustrating a memory system according to an exemplary embodiment of the inventive concept.

FIG. 13 is a block diagram illustrating a memory system according to an exemplary embodiment of the inventive concept. A memory system 200 may include a memory controller 200-1 and semiconductor memory modules 200-21 and 200-22. The semiconductor memory module 200-21 may include the ×4 semiconductor memory package 100-3, and the semiconductor memory module 200-22 may include the ×8 semiconductor memory package 100-2.

Referring to FIG. 13, the memory controller 200-1 may transmit an address and command signal C/A1 to the semiconductor memory module 200-21, and transmit an address and command signal C/A2 to the semiconductor memory module 200-22. Two ×4 semiconductor memory packages 100-3 of the semiconductor memory module 200-21 may input data D0 to D3, D4 to D7 and two data strobe signal pairs (DQS1B, DQS1), (DQS2B, DQS2) transmitted from the memory controller 200-1 through the data balls DQ0 to DQ3 and the data strobe signal pair balls DQSB and DQS of each of the two ×4 semiconductor memory packages 100-3 in response to the address and command signal C/A1. Each of the ×8 semiconductor memory packages 100-2 of the semiconductor memory module 200-22 may input data D0 to D7 and two data strobe signal pairs (DQS1B, DQS1), (DQSB2, DQS2) transmitted from the memory controller 200-1 through the data balls DQ0 to DQ7 and the data strobe signal pair balls DQSB, DQS, the inverted termination data strobe signal ball TDQSB', and the data mask signal/termination data strobe signal ball DM'/TDQS' in response to the address and command signal C/A2. The ×8 semiconductor memory package 100-2 may terminate an extra data strobe signal pair DQS2B, DQS2 input through the inverted termination data strobe signal ball TDQSB' and the data mask signal/termination data strobe signal ball DM'/TDQSB'.

According to exemplary embodiments of the inventive concept, the semiconductor memory modules 200-21 and 200-22 shown in FIG. 13 may include the semiconductor memory packages inputting and outputting data having the same number of bits.

Figure 14:
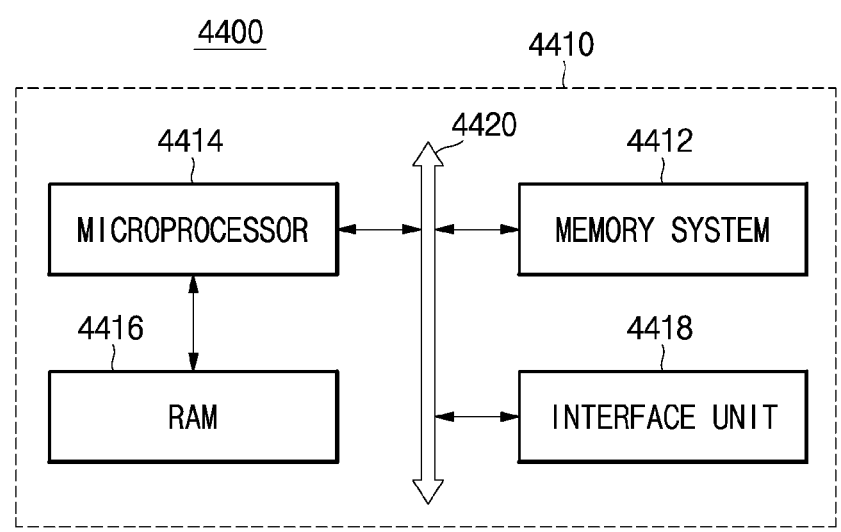
FIG. 14 is a block diagram illustrating an electronic system including a semiconductor memory chip or a semiconductor memory package according to an exemplary embodiment of the inventive concept

FIG. 14 is a block diagram illustrating an electronic system including a semiconductor memory chip or a semiconductor memory package according to an exemplary embodiment of the inventive concept.

Referring to FIG. 14, an electronic system 4400 includes a body 4410. In this context the body 4410 refers to, for example, a system board or a motherboard having a PCB. A memory system 4412, a microprocessor 4414, a random access memory (RAM) 4416, an interface unit 4418, and a bus 4420 are included in the body 4410. The microprocessor 4414 controls the electronic system 4400. The RAM 4416 is used as an operation memory of the microprocessor 4414. The microprocessor 4414, the RAM 4416, and/or other components may be fabricated in a single package. The interface unit 4418 may perform a function of inputting and outputting data from/to the electronic system 4400. The memory system 4412 may perform a function of storing operation codes of the microprocessor 4414, data processed by the microprocessor 4414, or external input data. The memory system 4412 may include a memory controller, a semiconductor memory package, or a semiconductor memory module. The memory system 4412 may have the configuration shown in FIG. 13.

The electronic system 4400 may be applied to, for example, a mobile device or a computer. In exemplary embodiments of the inventive concept, the semiconductor memory chip or the semiconductor memory package described above with reference to FIGS. 1 to 12 may be included in at least one among the memory system 4412, the microprocessor 4414, and the RAM 4416. Accordingly, overall operation performance of the electronic system 4400 may be improved.

According to exemplary embodiments of the inventive concept, a semiconductor memory chip includes an improved configuration of pad arrangements capable of satisfying all of the ball arrangements of the semiconductor memory packages in which the number of bits of input and output data are different from each other.

Accordingly, when fabricating the semiconductor memory chip into the semiconductor memory packages in which the number of bits of input and output data are different from each other, the configuration of line arrangements in the PCB may be improved (e.g., the ease of configuring line arrangements during fabrication may be improved), and the signal integrity may be improved.

Further, reliability of an operation of the system using the semiconductor memory chip or the semiconductor memory package may be improved.

According to exemplary embodiments of the inventive concept, when arranging the pads in the body of the semiconductor memory chip, lengths of the signal lines between corresponding pads and balls may be decreased, so that the wirings in the PCB may be conveniently configured while satisfying all of the ball arrangements of the semiconductor memory packages.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor memory chip, comprising:
    a plurality of upper data pads disposed in an upper data pad region on a surface of the semiconductor memory chip;
    upper data strobe signal pair pads disposed in the upper data pad region;
    an upper data mask signal pad disposed in the upper data pad region;
    a plurality of lower data pads disposed in a lower data pad region on the surface, wherein the lower data pad region is adjacent to and below the upper data pad region;
    lower data strobe signal pair pads disposed in the lower data pad region;
    a lower data mask signal pad disposed in the lower data pad region; and
    an inverted termination data strobe signal pad disposed in an additional pad region adjacent to and above the upper data pad region,
    wherein the inverted termination data strobe signal pad is internally connected to the upper data mask signal pad, the inverted termination data strobe signal pad is used to connect the semiconductor memory chip to a second printed circuit board (PCB) in a second semiconductor memory package having a second configuration, and the upper data mask signal pad is used to connect the semiconductor memory chip to a first PCB in a first semiconductor memory package having a first configuration different from the second configuration,
    wherein the semiconductor memory chip comprises a path selection unit configured to generate upper data and lower data which are internally generated for the first semiconductor memory package configuration, and generate the lower data for the second semiconductor memory package configuration, and an upper data read unit configured to drive the upper data and generate the upper data and an upper data strobe signal pair for the first semiconductor memory package configuration to transmit the upper data and the upper data strobe signal pair to the plurality of upper data pads and the upper data strobe signal pair pads, and drive the lower data and generate the lower data and a lower data strobe signal pair for the second semiconductor memory package configuration to transmit the lower data and the lower data strobe signal pair to the plurality of upper data pads and the upper data strobe signal pair pads.

2. A semiconductor memory chip. comprising;
a plurality of upper data pads disposed in an upper data pad region on a surface of the semiconductor memory chip;
upper data strobe signal pair pads disposed in the upper data pad region;
an upper data mask signal pad disposed in the upper data pad region;
a plurality of lower data pads disposed in a lower data pad region on the surface, wherein the lower data pad region is adjacent to and below the upper data pad region;
lower data strobe signal pair pads disposed in the lower data pad region;
a lower data mask signal pad disposed in the lower data pad region; and
an inverted termination data strobe signal pad disposed in an additional pad region adjacent to and above the upper data pad region,
wherein the inverted termination data strobe signal pad. is internally connected to the upper data mask signal pad, the inverted termination data strobe signal pad is used to connect the semiconductor memory chip to a second printed circuit board (PCB) in a second semiconductor memory package having a second configuration, and the upper data mask signal pad is used to connect the semiconductor memory chip to a first PCB in a first semiconductor memory package having a first configuration different from the second configuration, and
wherein the semiconductor memory chip internally generates upper data through first upper data lines to transmit the upper data through the upper data pads and generates lower data through first lower data lines to transmit the lower data through the lower data pads when the semiconductor memory chip is disposed in the first memory package, and internally generates the lower data through the first lower data lines to transmit the lower data through the upper data pads when the semiconductor memory chip is disposed in the second semiconductor memory package, or wherein the semiconductor memory chip receives the upper data and the upper data strobe signal pair applied through the upper data pads and the upper data strobe signal pair pads for the first semiconductor memory package to transmit the upper data to the first upper data lines and receives the lower data and the lower data strobe signal pair applied through the lower data pads and the lower data strobe signal pair pads for the first semiconductor memory package to transmit the lower data to the first lower data lines, and receives the lower data and the lower data strobe signal pair applied through the upper data pads and the upper data strobe signal pair pads for the second semiconductor memory package to transmit the lower data to the first lower data lines.

3. The semiconductor memory chip of claim 2, further comprising:
a data mask signal/termination data strobe signal pad disposed in the additional pad region,
wherein the data mask signal/termination data strobe signal pad is internally connected to the lower data mask signal pad, the data mask signal/termination data strobe signal pad is used to connect the semiconductor memory chip to the second PCB in the second semiconductor memory package or to a third PCB in a third semiconductor memory package having a third configuration different from the first configuration and the third configuration, and the lower data mask signal pad is used to connect the semiconductor chip to the first PCB in the first semiconductor memory package.

4. The semiconductor memory chip of claim 3, wherein the upper data mask signal pad is arranged in a lower left side in the upper data pad region, the lower data mask signal pad is arranged in an upper right side in the lower data pad region, the upper data strobe signal. pair pads are arranged in an upper right side in the upper data pad region, the inverted termination data strobe signal pair is arranged in the upper left side in the additional pad region, and the data mask signal/termination data strobe signal pad is arranged in a right side in the additional pad region.

5. The semiconductor memory chip of claim 3, further comprising:
additional data strobe signal pair pads disposed in the additional pad region,
wherein the additional data strobe signal pair pads are internally connected to the upper data strobe signal pair pads, the additional data strobe signal pair pads are used to connect the semiconductor memory chip to the second PCB in the second semiconductor memory package or to the third PCB in the third semiconductor memory package, and the upper data strobe signal pair pads are used to connect the semiconductor memory chip to the first PCB in the first semiconductor memory package.

6. The semiconductor memory chip of claim 5, wherein the upper data mask. signal pad is arranged in a lower left side in the upper data pad region, the lower data mask signal pad is arranged in an upper right side in the lower data pad region, the upper data strobe signal pair pads are arranged in an upper right side in the upper data pad region, the inverted termination data strobe signal pair is arranged in the upper left side in the additional pad region, the data mask signal/termination data strobe signal pad is arranged in a right side in the additional pad region, and the additional data strobe signal pair pads are arranged below the inverted termination data strobe signal pad in the additional pad region.

7. The semiconductor memory chip of claim 5, Wherein, when the semiconductor memory chip receives an extra inverted data strobe signal through the inverted termination. data strobe signal pad, receives a data mask signal or an extra data strobe signal through. the data mask signal/ terminal data strobe signal pad, and receives a data strobe signal pair through the additional data strobe signal pair pads, the semiconductor memory chip terminates the extra inverted data strobe signal and the extra data strobe signal received through. the upper data mask signal pad and the lower data mask signal pad, receives the data mask signal received through the lower data mask signal pad, and receives the data strobe signal pair through the upper data strobe signal pair pads.

8. The semiconductor memory chip of claim 3, further comprising:
an empty region arranged below the inverted termination data strobe signal pad in the additional pad region.

9. The semiconductor memory chip of claim 3, wherein the semiconductor memory chip comprises:

a path selection unit configured to transmit the upper data generated through the first upper data lines to second upper data lines and transmit the lower data generated through the first lower data lines to second lower data lines for the first semiconductor memory package, and transmit the lower data generated through. the first lower data lines to the second upper data lines for the second semiconductor memory package or the third semiconductor memory package, or configured to receive the lower data transmitted through the second lower data lines to transmit the lower data to the first lower data lines and receive the upper data transmitted through the second upper data lines to transmit the upper data to the first upper data lines for the first semiconductor package, and receive the lower data transmitted through the second upper data lines to transmit the lower data to the first lower data lines for the second semiconductor memory package or the third semiconductor memory package;

an upper data read unit configured to drive the upper data transmitted through the second upper data lines for the first semiconductor memory package to generate the upper data and the upper data strobe signal pair to the plurality of upper data pads and the upper data strobe signal pair pads and drive the lower data transmitted through the second lower data lines for the first semiconductor memory package to generate the lower data and a lower data strobe signal pair for the first semiconductor memory package, and drive the lower data transmitted through the second upper data lines for the second semiconductor memory package or the third semiconductor memory package to generate the lower data and the lower data strobe signal pair to the plurality of upper data pads and the upper data strobe signal pair pads;

a lower data read unit configured to drive the lower data transmitted through the second lower data lines for the first semiconductor memory package to generate the lower data and the lower data strobe signal pair to the plurality of lower data pads and the lower data strobe signal pair pads;

a lower data write unit configured to receive the lower data and the lower data strobe signal pair which are externally applied through the lower data pads and the lower data strobe signal pair pads for the first semiconductor memory package to transmit the lower data to second lower data lines; and an upper data write unit configured to receive the upper data and the upper data strobe signal pair which are externally applied through the upper data pads and the upper data strobe signal pair pads for the first semiconductor memory package to transmit the upper data to second upper data lines, and receive the lower data and the lower data strobe signal pair which are externally applied through the upper data pads and the upper data strobe signal pair pads for the second semiconductor memory package or the third semiconductor memory package to transmit the lower data to second upper data lines.

10. The semiconductor memory chip of claim 3, wherein the semiconductor memory chip comprises:

an upper data read unit configured to drive the upper data transmitted through the first upper data lines to generate the upper data and the upper data strobe signal pair for the first semiconductor memory package;

a lower data read unit configured to drive the lower data transmitted through the first lower data lines to generate the lower data and the lower data strobe signal pair for the first semiconductor memory package, the second semiconductor memory package, or the third semiconductor memory package;

a lower data write unit configured to receive the lower data and the lower data strobe signal pair for the first semiconductor memory package, the second semiconductor memory package, or the third semiconductor memory package to transmit the lower data to the first lower data lines;

an upper data write unit configured to receive the upper data and the upper data strobe signal pair which are externally applied through the upper data pads and the upper data strobe signal pair pads for the first semiconductor memory package to transmit the upper data to the first upper data lines; and a path selection unit configured to transmit the upper data and the upper data strobe signal pair output from the upper data read unit to the upper data pads and the upper data strobe signal pair pads and transmit the lower data and the lower data strobe signal pair output from the lower data read unit to the lower data pads and the lower data strobe signal pair pads for the first semiconductor memory package, and transmit the lower data and the lower data strobe signal pair output from the lower data read unit to the upper data pads and the upper data strobe signal pair pads for the second semiconductor memory package or the third semiconductor memory package, or configured to receive the upper data and the upper data strobe signal pair which are externally applied through the upper data pads and the upper data strobe signal pair pads to transmit the upper data and the upper data strobe signal pair to the upper data write unit and receive the lower data and the lower data strobe signal pair which are externally applied through the lower data pads and the lower data strobe signal pair pads to transmit the lower data and the lower data strobe signal pair to the lower data write unit for the first semiconductor memory package, and receive the lower data and the lower data strobe signal pair which are externally applied through the upper data pads and the upper data strobe signal pair pads for the second semiconductor memory package or the third semiconductor memory package to transmit the lower data to the lower data write unit.

11. The semiconductor memory chip of claim 3, wherein the first, the second, and the third semiconductor memory packages are ×16n, ×8n, and ×4n semiconductor memory packages, respectively, and the first, the second, and the third configurations have ball arrangements standardized by JOINT ELECTRON DEVICE ENGINEERING COUNCIL (JEDEC), Wherein n is an integer equal to or greater than 1.

12. A semiconductor memory package, comprising:

a semiconductor memory chip, comprising: a plurality of upper data pads disposed in an upper data pad region on a surface of the semiconductor memory chip; upper data strobe signal pair pads disposed in the upper data pad region; an upper data mask signal pad disposed in the upper data pad region; a plurality of lower data pads disposed in a lower data pad region on the surface, wherein the lower data pad region is adjacent to and below the upper data pad region;

lower data strobe signal pair pads disposed in the lower data pad region; a lower data mask signal pad disposed in the lower data pad region; and an inverted termination data strobe signal pad disposed in an additional pad region adjacent to and above the upper data pad region, wherein the inverted termination data strobe signal pad is internally connected to the upper data mask signal pad, the inverted termination data strobe signal pad is used to connect the semiconductor memory chip to a second printed circuit board (PCB) in a second semiconductor memory package having a second configuration, and the upper data mask signal pad is used to connect the semiconductor memory chip to a first PCB in a first semiconductor memory package having a first configuration different from the second configuration, and wherein the semiconductor memory chip internally generates upper data through first upper data lines to transmit the upper data through the upper data pads and generates lower data through first lower data lines to transmit the lower data through the lower data pads when the semiconductor memory chip is disposed in the first memory package, and internally generates the lower data through the first lower data lines to transmit the lower data through the upper data pads when the semiconductor memory chip is disposed in the second semiconductor memory package, or wherein the semiconductor memory chip receives the upper data and the upper data strobe signal pair applied through the upper data pads and the upper data strobe signal pair pads for the first semiconductor memory package to transmit the upper data to the first upper data lines and receives the lower data and the lower data strobe signal pair applied through the lower data pads and the lower data strobe signal pair pads for the first semiconductor memory package to transmit the lower data to the first lower data lines, and receives the lower data and the lower data strobe signal pair applied through the upper data pads and the upper data strobe signal pair pads for the second semiconductor memory package to transmit the lower data to the first lower data lines; and a printed circuit board (PCB) comprising first board pads arranged in positions corresponding to the upper data pads and the inverted termination data strobe signal pad of the semiconductor memory chip, and lines arranged for connecting first balls of the second semiconductor memory package corresponding to the first board pads, wherein the semiconductor memory package is one of the first semiconductor memory package and the second semiconductor memory package.

13. The semiconductor memory package of claim 12, wherein the semiconductor memory chip further comprises a data mask signal/termination data strobe signal pad disposed in the additional pad region,
wherein the data mask signal/termination data strobe signal pad is internally connected to the lower data mask signal pad and is used for the second and third semiconductor memory packages, and the lower data mask signal pad is used for the first semiconductor memory package, and
wherein the PCB comprises a second board pad arranged in a position corresponding to the data mask signal/termination data strobe signal pad, and a line arranged for connecting the second board pad and a second ball of the second semiconductor memory package or the third semiconductor memory package corresponding to the second board pad.

14. The semiconductor memory chip of claim 13, wherein the upper data mask signal pad is arranged in a lower left side in the upper data pad region, the lower data mask signal pad is arranged in an upper right side in the lower data pad region, the upper data strobe signal pair pads are arranged in an upper right side in the upper data pad region, the inverted termination data strobe signal pair is arranged in the upper left side in the additional pad region, and the data mask signal/termination data strobe signal pad is arranged in a right side in the additional pad region.

15. The semiconductor memory package of claim 12, wherein the semiconductor memory chip further comprises additional data strobe signal pair pads disposed in the additional pad region,
wherein the additional data strobe signal pair pads are internally connected to the upper data strobe signal pair pads and are used for the second and the third semiconductor memory packages, and the upper data strobe signal pair pads are used for the first semiconductor memory package,
wherein the PC comprises third board pads arranged in positions corresponding to the additional data strobe signal pair pads, and lines arranged for connecting the third board pads and third balls of the second semiconductor memory package or the third semiconductor memory package corresponding to the third board pads.

16. The semiconductor memory chip of claim 15, wherein the upper data mask signal pad is arranged in a lower left side in the upper data pad region, the lower data mask signal pad is arranged in an upper right side in the lower data pad region, the upper data strobe signal pair pads are arranged in an upper right side in the upper data pad region, the inverted termination data strobe signal pair is arranged in the upper left side in the additional pad region, the data mask signal/termination data strobe signal pad is arranged in a right side in the additional pad region, and the additional data strobe signal pair pads are arranged below the inverted termination data strobe signal pad in the additional pad region.

17. The semiconductor memory package of claim 12, wherein the semiconductor memory chip comprises an empty region arranged below the inverted termination data strobe signal pad in the additional pad region,
wherein the PCB comprises third board pads arranged in positions corresponding to the upper data strobe signal pair pads, a board empty region arranged in a position corresponding to the empty region, and lines arranged through the board empty region for connecting the third board pads and third balls of the second semiconductor memory package or the third semiconductor memory package.

18. The semiconductor memory package of claim 12, wherein the semiconductor memory chip comprises:
a path selection unit configured to transmit the upper data generated through the first upper data lines to second upper data lines and transmit the lower data generated through the first lower data lines to second lower data lines for the first semiconductor memory package, and transmit the lower data generated through the first lower data hues to the second upper data lines for the second semiconductor memory package or the third semiconductor memory package, or configured to receive the lower data transmitted through the second lower data lines to transmit the lower data to the first lower data lines and receive the upper data transmitted through the second upper data lines to transmit the upper data to the first upper data lines for the first semiconductor package, and receive the lower data transmitted through the second upper data lines to transmit the lower data to the first lower data lines for the second semiconductor memory package or the third semiconductor memory package;
an upper data read unit configured to drive the upper data transmitted through the second upper data lines for the first semiconductor memory package to generate the upper data and the upper data strobe signal pair to the plurality of upper data pads and the upper data strobe signal pair pads and drive the lower data transmitted through the second lower data lines for the first semiconductor memory package to generate the lower data and a lower data strobe signal pair for the first semiconductor memory package, and drive the lower data transmitted through the second upper data lines for the second semiconductor memory package or the third semiconductor memory package to generate the lower data and the lower data strobe signal pair to the plurality of upper data pads and the upper data strobe signal pair pads;

a lower data read unit configured to drive the lower data transmitted through the second lower data lines for the first semiconductor memory package to generate the lower data and the lower data strobe signal pair to the plurality of lower data pads and the lower data strobe signal pair pads;

a lower data write unit configured to receive the lower data and the lower data strobe signal pair which are externally applied through the lower data pads and the lower data strobe signal pair pads for the first semiconductor memory package to transmit the lower data to second lower data lines; and an upper data write unit configured to receive the upper data and the upper data strobe signal pair which are externally applied through the upper data pads and the upper data strobe signal pair pads for the first semiconductor memory package to transmit the upper data to second upper data lines, and receive the lower data and the lower data strobe signal pair which are externally applied through the upper data pads and the upper data strobe signal pair pads for the second semiconductor memory package or the third semiconductor memory package to transmit the lower data to second upper data lines.

19. The semiconductor memory package of claim 12, wherein the semiconductor memory chip comprises:

an upper data read unit configured to drive the upper data transmitted through the first upper data lines to generate the upper data and the upper data strobe signal pair for the first semiconductor memory package;

a lower data read unit configured to drive the lower data transmitted through the first lower data lines to generate the lower data and the lower data strobe signal pair for the first semiconductor memory package, the second semiconductor memory package, or the third semiconductor memory package;

a lower data write unit configured to receive the lower data and the lower data strobe signal pair for the first semiconductor memory package, the second semiconductor memory package, or the third semiconductor memory package to transmit the lower data to the first lower data lines;

an upper data write unit configured to receive the upper data and the upper data strobe signal pair which are externally applied through the upper data pads and the upper data strobe signal pair pads for the first semiconductor memory package to transmit the upper data to the first upper data lines; and a path selection unit configured to transmit the upper data and the upper data strobe signal pair output from the upper data read unit to the upper data pads and the upper data strobe signal pair pads and transmit the lower data and the lower data strobe signal pair output from the lower data read unit to the lower data pads and the lower data strobe signal pair pads for the first semiconductor memory package, and transmit the lower data and the lower data strobe signal pair output from the lower data read unit to the upper data pads and the upper data strobe signal pair pads for the second semiconductor memory package or the third semiconductor memory package, or configured to receive the upper data and the upper data strobe signal pair which are externally applied through the upper data pads and the upper data strobe signal pair pads to transmit the upper data and the upper data strobe signal pair to the upper data write unit and receive the lower data and the lower data strobe signal pair which are externally applied through the lower data pads and the lower data strobe signal pair pads to transmit the lower data and the lower data strobe signal pair to the lower data write unit for the first semiconductor memory package, and receive the lower data and the lower data strobe signal pair which are externally applied through the upper data pads and the upper data strobe signal pair pads for the second semiconductor memory package or the third semiconductor memory package to transmit the lower data to the lower data write unit.

20. The semiconductor memory package of claim 12, wherein the first, the second, and the third semiconductor memory packages are ×16n, ×8n, and ×4n semiconductor memory packages, respectively, and the first, the second, and the third configurations have ball arrangements standardized by JOINT ELECTRON DEVICE ENGINEERING COUNCIL (JEDEC), wherein n is an integer equal to or greater than 1.

* * * * *